(12) United States Patent
Lee

(10) Patent No.: US 11,139,041 B2
(45) Date of Patent: Oct. 5, 2021

(54) STACKED SEMICONDUCTOR DEVICE AND TEST METHOD THEREOF

(71) Applicant: SK hynix Inc., Gyeonggi-do (KR)

(72) Inventor: Yo-Sep Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 84 days.

(21) Appl. No.: 16/668,129

(22) Filed: Oct. 30, 2019

(65) Prior Publication Data

US 2020/0303030 A1     Sep. 24, 2020

(30) Foreign Application Priority Data

Mar. 20, 2019   (KR) .......................... 10-2019-0031886

(51) Int. Cl.
*G11C 29/14* (2006.01)
*H01L 25/065* (2006.01)
(Continued)

(52) U.S. Cl.
CPC ............ *G11C 29/14* (2013.01); *G11C 7/1051* (2013.01); *G11C 7/1096* (2013.01); *G11C 7/22* (2013.01); *G11C 8/06* (2013.01); *G11C 8/10* (2013.01); *G11C 8/18* (2013.01); *G11C 29/18* (2013.01); *G11C 29/36* (2013.01); *H01L 25/0657* (2013.01); *H03K 21/38* (2013.01); *H01L 2225/06541* (2013.01); *H01L 2225/06596* (2013.01)

(58) Field of Classification Search
CPC ................ G11C 29/14; H01L 25/0657; H01L 2225/06596
See application file for complete search history.

(56) References Cited

U.S. PATENT DOCUMENTS 9,298,573 B2    3/2016 Kobla et al.
9,689,918 B1 *  6/2017 Cheng ............ G01R 31/318513
(Continued)

FOREIGN PATENT DOCUMENTS

KR    10-2017-0066082    6/2017

OTHER PUBLICATIONS

S. K. Goel, "Test challenges in designing complex 3D chips: What in on the horizon for EDA industry?: Designer track," 2012 IEEE/ACM International Conference on Computer-Aided Design (ICCAD), San Jose, CA, USA, 2012, pp. 273-273.*
(Continued)

*Primary Examiner* — Steve N Nguyen
(74) *Attorney, Agent, or Firm* — IP & T Group LLP

(57) ABSTRACT

A stacked semiconductor device includes semiconductor chips, each including a signal transfer circuit respectively transferring a command, an address, and a chip select signal to first to third through electrodes, and respectively transferring a test address and a chip ID to the second and third through electrodes according to a test control signal; a command reception circuit transferring a test command or a signal transferred from the first through electrode to an internal circuit when a signal transferred from the third through electrode is identical to the chip ID coincide with each other; and a test control circuit activating the test control signal according to deactivation of a test control signal of an upper chip, and generating the test command and the test address according to the test control signal.

30 Claims, 18 Drawing Sheets

(51) Int. Cl.
*H03K 21/38* (2006.01)
*G11C 8/10* (2006.01)
*G11C 7/22* (2006.01)
*G11C 7/10* (2006.01)
*G11C 8/18* (2006.01)
*G11C 29/36* (2006.01)
*G11C 29/18* (2006.01)
*G11C 8/06* (2006.01)

(56) References Cited

U.S. PATENT DOCUMENTS

| | | | | |
|---|---|---|---|---|
| 10,026,724 | B2* | 7/2018 | Kim | H01L 23/3185 |
| 2006/0180911 | A1* | 8/2006 | Jeong | H01L 21/6835 |
| | | | | 257/686 |
| 2012/0138927 | A1* | 6/2012 | Kang | G01R 31/318513 |
| | | | | 257/48 |
| 2012/0262196 | A1* | 10/2012 | Yokou | G11C 29/025 |
| | | | | 324/750.3 |
| 2014/0021978 | A1* | 1/2014 | Ikeda | G01R 31/2889 |
| | | | | 324/762.06 |
| 2019/0088348 | A1* | 3/2019 | Jain | G11C 29/36 |
| 2019/0096776 | A1* | 3/2019 | Nishioka | G01R 31/2884 |

OTHER PUBLICATIONS

S. K. Roy, D. Roy, C. Giri and H. Rahman, "Testing 3D stacked ICs for post-bond partial/complete stack," 2012 IEEE 55th International Midwest Symposium on Circuits and Systems (MWSCAS), Boise, ID, USA, 2012, pp. 522-525.*

Liang-Che Li, Wen-Hsuan Hsu, Kuen-Jong Lee and Chun-Lung Hsu, "An efficient 3D-IC on-chip test framework to embed TSV testing in memory BIST," The 20th Asia and South Pacific Design Automation Conference, Chiba, Japan, 2015, pp. 520-525.*

S. Lu, U. Lu, S. Pong and H. Cheng, "Efficient test and repair architectures for 3D TSV-based random access memories," 2013 International Symposium onVLSI Design, Automation, and Test (VLSI-DAT), Hsinchu, Taiwan, 2013, pp. 1-4.*

* cited by examiner

STACKED SEMICONDUCTOR DEVICE AND TEST METHOD THEREOF

CROSS-REFERENCE TO RELATED APPLICATION

This application claims priority under 35 U.S.C. § 119 to Korean Patent Application No. 10-2019-0031886, filed on Mar. 20, 2019, which is incorporated herein by reference in its entirety.

BACKGROUND

1. Field

Various embodiments relate to semiconductor design technology, and more particularly, to a built-in self-test (BIST) method of a stacked semiconductor device.

2. Discussion of the Related Art

As semiconductor technology continues to rapidly develop, the need for high integration and high performance of packaging technology for a semiconductor integrated device increases. Therefore, various three-dimensional structure technologies for vertically stacking semiconductor chips have been developed, improving on two-dimensional structure technology for disposing semiconductor chips implemented with integrated circuits on a printed circuit board (PCB) by using wires or bumps.

Such a three-dimensional structure may be implemented through a stacked semiconductor device in which a plurality of semiconductor chips are vertically stacked. The semiconductor chips mounted in a vertical direction are electrically coupled to one another by through-silicon vias (TSV) or through electrodes and are mounted on a substrate for a semiconductor package.

SUMMARY

Various embodiments are directed to a stacked semiconductor device capable of sequentially performing a built-in self-test (BIST) on a plurality of stacked semiconductor chips.

Also, various embodiments are directed to a stacked semiconductor device capable of independently performing the BIST on a plurality of stacked semiconductor chips.

In an embodiment, a stacked semiconductor device includes a plurality of semiconductor chips stacked in a particular direction, electrically coupled through a plurality of through electrodes, and assigned with respective chip identifications (IDs) to distinguish one from another, wherein each of the semiconductor chips comprises: a signal transfer circuit suitable for respectively transferring a command, an address, and a chip select signal to first to third through electrodes, and respectively transferring a test address and the corresponding chip ID to the second and third through electrodes according to a test control signal; a command reception circuit suitable for transferring a test command or a signal, transferred from the first through electrode, to an internal circuit when a signal transferred from the third through electrode is identical to the corresponding chip ID; and a test control circuit suitable for activating the test control signal according to deactivation of a test control signal of an upper chip, of the plurality of semiconductor chips, and generating the test command and the test address according to the test control signal.

In an embodiment, a stacked semiconductor device includes a plurality of semiconductor chips stacked in a particular direction, electrically coupled through a plurality of through electrodes, and assigned with respective chip identifications (IDs) to distinguish one from another, wherein each of the semiconductor chips comprises: a control signal generation circuit suitable for generating a sum signal of by summing a sum signal of an upper chip and a test enable signal of the corresponding chip, and activating a test start signal according to deactivation of the sum signal of the corresponding chip; a command/address generation circuit suitable for activating the test enable signal according to the test start signal, and generating a test address and a test command according to the test enable signal; and an internal circuit suitable for performing a test operation based on the test address and the test command.

In an embodiment, a test method of a stacked semiconductor device includes activating, by each of a plurality of semiconductor chips, a corresponding test control signal according to a specific command or deactivation of a test control signal of an upper chip of the plurality of semiconductor chips, which are stacked, electrically coupled through a plurality of through electrodes, and assigned with respective chip identifications (IDs) to distinguish one from another; generating, by each of the semiconductor chips, a test command and a test address according to the corresponding test control signal; and performing, by each of the semiconductor chips, a test operation of an internal circuit according to the test address and the test command; and deactivating, by each of the semiconductor chips, the corresponding test control signal according to completion of the test operation.

In an embodiment, a stacked semiconductor device includes a plurality of stacked semiconductor chips, the plurality of semiconductor chips including an uppermost chip and a lowermost chip; and a plurality of through electrodes suitable for coupling the is plurality of semiconductor chips; wherein the plurality of semiconductor chips sequentially performs a test operation in an order from the uppermost chip to the lowermost chip, and wherein each of the plurality of semiconductor chips includes a test control circuit, the test control circuit for the uppermost chip receiving a command from an external source to activate a test operation on the uppermost chip, and the test control circuit for each of the remaining semiconductor chips receiving a test control signal indicating completion of the test operation on the immediately above semiconductor chip through a through electrode, among the plurality of through electrodes, to activate the corresponding test operation.

According to the stacked semiconductor device in accordance with an embodiment, it is possible to sequentially or independently perform a built-in self-test (BIST) on a plurality of stacked semiconductor chips, so that it is possible to substantially prevent instantaneous power-drop.

Furthermore, according to the stacked semiconductor device in accordance with an embodiment, an address selection circuit for the BIST is disposed in a transfer circuit instead of a reception circuit, so that it is possible to minimize an increase in an area due to circuits additionally disposed for the BIST.

DETAILED DESCRIPTION

Figure 1:
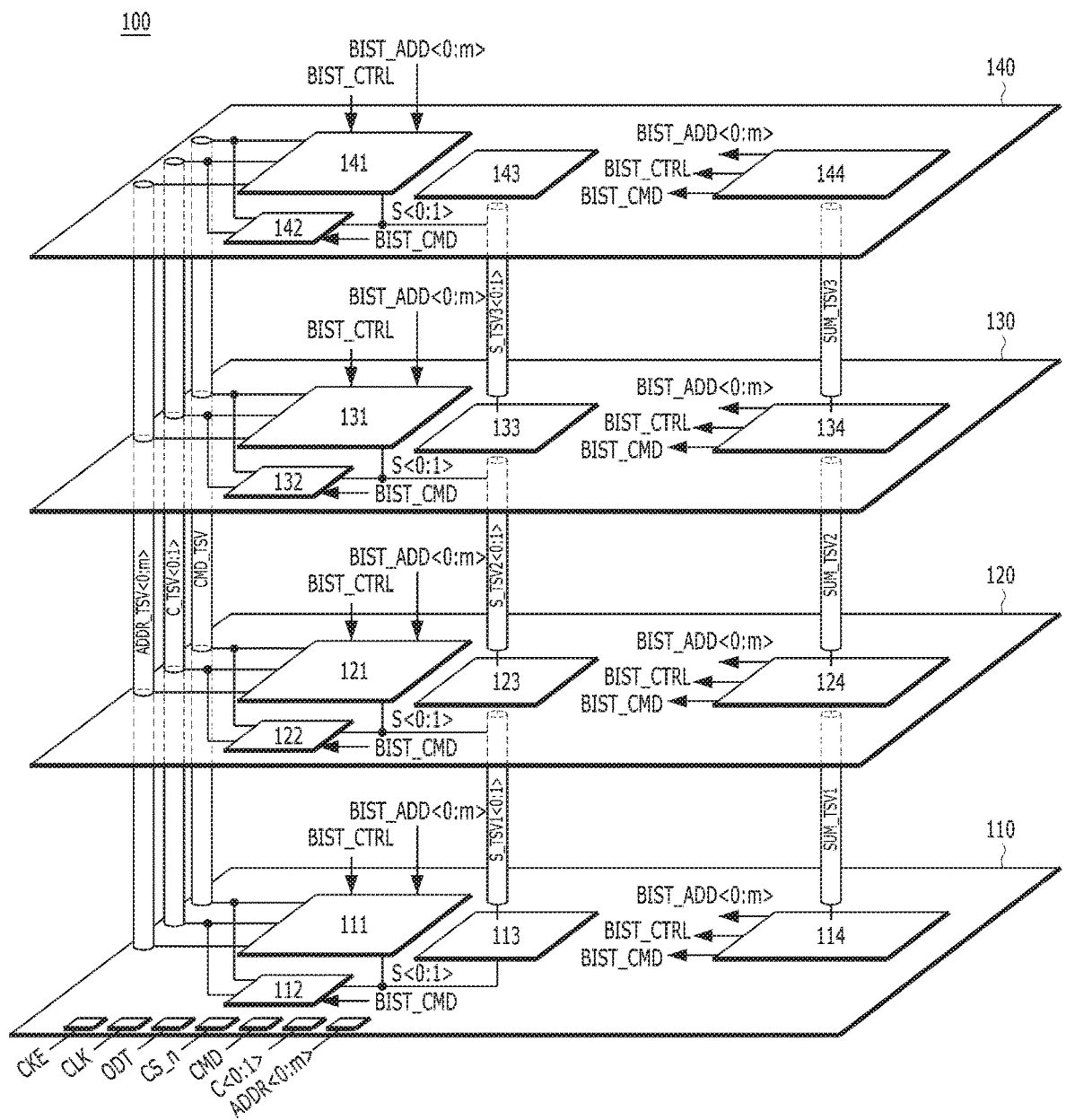
FIG. 1 is a diagram illustrating a configuration of a stacked is semiconductor device in accordance with an embodiment of the present invention.

Various embodiments are described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

Throughout the specification, when one element is referred to as being 'connected to' or 'coupled to' another element, it may indicate that the former element is directly connected or coupled to the latter element or electrically connected or coupled to the latter element with one or more other elements interposed therebetween. Furthermore, when an element "includes" or "comprises" a component, it means that the element does not exclude another component but may further include or comprise another component, unless stated otherwise. Moreover, a component described in the singular form is not necessarily a single instance of such component; rather, such component may include multiple instances.

FIG. 1 is a diagram illustrating a configuration of a stacked semiconductor device 100 in accordance with an embodiment of the present invention.

Referring to FIG. 1, the stacked semiconductor device 100 includes first to fourth semiconductor chips 110, 120, 130, and 140 stacked in a particular direction, which is the vertical direction as shown in FIG. 1, and electrically coupled to one another through a plurality of through electrodes. The first to fourth semiconductor chips 110, 120, 130, and 140 are substantially the same type and may be configured as memory chips having a core area including a memory cell array. Although the illustrated stacked semiconductor device 100 includes four stacked chips, the present invention is not limited to any specific number of chips. In accordance with an embodiment, the first to fourth semiconductor chips 110, 120, 130, and 140 may be implemented as any of various different types, such as processors and memory chips, logic chips and memory chips, and buffer chips and/or memory chips.

The first semiconductor chip 110 may serve as a master chip that performs an interface function with an external device, for example, a memory controller (not illustrated). Further, the first semiconductor chip 110 may perform a signal distribution function of buffering a command CMD, an address ADDR<0:m>, a clock CLK, and data provided from the memory controller and transmitting the buffered command CMD, address ADDR<0:m>, clock CLK, and data to the second to fourth semiconductor chips 120, 130, and 140. The first semiconductor chip 110 may perform a read and/or write operation on the memory cell array of the core area in the first semiconductor chip 110 on the basis of the command CMD, the address ADDR<0:m>, a chip select signal C<0:1>, the clock CLK, and the data. The chip select signal C<0:1> is for selecting a specific is semiconductor chip of the stacked semiconductor chips 110 to 140 and may be inputted together with the command CMD and the address ADDR<0:m>. For example, the memory controller may transfer a chip select signal C<0:1> of "00" to the stacked semiconductor device 100 in order to select the first semiconductor chip 110, and may transfer a chip select signal C<0:1> of "11" to the stacked semiconductor device 100 in order to select the fourth semiconductor chip 140. As illustrated in FIG. 1, the first semiconductor chip 110 may additionally receive an external chip select signal CS_n, a clock enable signal CKE, and a termination signal ODT.

Each of the second to fourth semiconductor chips 120, 130, and 140 may perform a read and/or write operation on the memory cell array in the core area thereof on the basis of the command CMD, the address ADDR<0:m>, the chip select signal C<0:1>, the clock CLK, and the data transferred from the first semiconductor chip 110 via the through electrodes. The second to fourth semiconductor chips 120, 130, and 140 may operate as slave chips with the first semiconductor chip 110 serving as the master chip.

For clarity, FIG. 1 does not illustrate data pads for receiving data and through electrodes for transferring data. The description below focuses on an operation of transferring the command CMD, the address ADDR<0:m>, and the chip select signal C<0:1>.

The through electrodes electrically connecting the first to fourth semiconductor chips 110, 120, 130, and 140 to one another may include first through electrodes CMD_TSV for transferring the command CMD, second through electrodes ADDR_TSV<0:m> for transferring the address ADDR<0:m>, third through electrodes C_TSV<0:1> for transferring the chip select signal C<0:1>, fourth through electrodes SUM_TSV1 to SUM_TSV3 for transferring a test control signal BIST_CTRL, and fifth through electrodes S_TSV1<0:1> to S_TSV3<0:1> for assigning a chip ID S<0:1>.

The first semiconductor chip 110 may include a transceiver (TX/RX) circuit 111, a command reception circuit 112, an identification (ID) assigning circuit 113, and a test control circuit 114. The second semiconductor chip 120 may include a transceiver (TX/RX) circuit 121, a command reception circuit 122, an ID assigning circuit 123, and a test control circuit 124. The third semiconductor chip 130 may include a transceiver (TX/RX) circuit 131, a command reception circuit 132, an ID assigning circuit 133, and a test control circuit 134. The fourth semiconductor chip 140 may include a transceiver (TX/RX) circuit 141, a command reception circuit 142, an ID assigning circuit 143, and a test control circuit 144.

The ID assigning circuits 113, 123, 133, and 143 may be implemented by an adder that increases an input signal by +1. At the time of power-up (or boot-up), a chip ID S<0:1> of "00" is assigned to the first semiconductor chip 110 serving as the master chip. The ID assigning circuit 113 of the first semiconductor chip 110 is may increase the chip ID S<0:1> of "00" by +1, thereby transferring a chip ID S<0:1> of "01" to the second semiconductor chip 120 through the fifth through electrodes S_TSV1<0:1>. Similarly, the ID assigning circuit 123 of the second semiconductor chip 120 may transfer a chip ID S<0:1> of "10" to the third semiconductor chip 130 through the fifth through electrodes S_TSV2<0:1>, and the ID assigning circuit 133 of the third semiconductor chip 130 may transfer a chip ID S<0:1> of "11" to the fourth semiconductor chip 140 through the fifth through electrodes S_TSV3<0:1>. In such a manner, a unique chip ID S<0:1> may be assigned to each of the first to fourth semiconductor chips 110, 120, 130, and 140. However, the present invention is not limited to any specific manner of generating/assigning respective unique chip IDs; other methods may be used.

The transceiver circuits 111, 121, 131, and 141 may transmit and receive signals, that is, the command CMD, the address ADDR<0:m>, and the chip select signal C<0:1>, to/from the first to third through electrodes CMD_TSV, ADDR_TSV<0:m>, and C_TSV<0:1>, according to the chip ID S<0:1>. During a normal operation of the stacked semiconductor device 100, the transceiver circuit 111 of the first semiconductor chip 110 may operate as a transmission TX circuit and a reception RX circuit, and the transceiver circuits 121, 131, and 141 of the second to fourth semiconductor chips 120, 130, and 140 may operate only as a reception RX circuit. That is, during the normal operation, the transceiver circuit 111 of the first semiconductor chip 110 may receive the command CMD, the address ADDR<0:m>, and the chip select signal C<0:1> from the memory controller and transfer the received command CMD, address ADDR<0:m>, and chip select signal C<0:1> to the first to third through electrodes CMD_TSV, ADDR_TSV<0:m>, and C_TSV<0:1>, respectively. On the other hand, during a test operation, the transceiver circuits 111, 121, 131, and 141 of the semiconductor chips may simultaneously operate as a transmission (TX) circuit and a reception (RX) circuit. That is, during the test operation, the transceiver circuits 111, 121, 131, and 141 of the semiconductor chips may receive the test control signal BIST_CTRL and the test address BIST_ADD<0:m> transferred from the test control circuits 114, 124, 134, and 144, and transfer the test address BIST_ADD<0:m> and the chip ID S<0:1> to the second and third through electrodes ADDR_TSV<0:m> and C_TSV<0:1>, respectively, according to the test control signal BIST_CTRL, thereby allowing the test operation, that is, the BIST to be performed.

The command reception circuits 112, 122, 132, and 142 may transfer the command CMD, or a test command BIST_CMD, when the chip select signal C<0:1> transferred through the third through electrodes C_TSV<0:1> and the assigned chip ID S<0:1> coincide with each other. The command CMD is transferred through the first through electrodes CMD_TSV. The test command BIST_CMD is transferred from the test control circuits 114, 124, 134 and 144 to respective internal circuits (that is, core areas).

The test control circuits 114, 124, 134, and 144 may activate the test control signal BIST_CTRL of a corresponding semiconductor chip according to the deactivation of the test control signal BIST_CTRL of an upper chip. Furthermore, the test control circuits 114, 124, 134, and 144 may generate the test command BIST_CMD and the test address BIST_ADD<0:m> according to the test control signal BIST_CTRL of the corresponding semiconductor chip. Particularly, in the present embodiment, the test control circuit 144 of the uppermost chip, that is, the fourth semiconductor chip 140, may generate a corresponding test control signal BIST_CTRL according to a specific command CMD (for example, a mode register set (MRS) command). Further, the test control circuit 144 may transfer the generated test control signal BIST_CTRL to lower chips, that is, the third to first semiconductor chips 130, 120, and 110, through the fourth through electrodes SUM_TSV1 to SUM_TSV3. Therefore, the test control circuits 114, 124, 134, and 144 may control all the semiconductor chips to be sequentially tested in the order of the fourth semiconductor chip 140 to the first semiconductor chip 110 by using the test control signal BIST_CTRL transferred from the upper chips through the fourth through electrodes SUM_TSV1 to SUM_TSV3. Furthermore, the test control circuits 114, 124, 134, and 144 may control each semiconductor chip to be independently tested by activating only the test control signal BIST_CTRL of a specific semiconductor chip according to the command CMD (for example, the MRS command).

A detailed configuration of each element of FIG. 1 is described below with reference to the drawings.

In the present embodiment, the test control signal BIST_CTRL may include a test enable signal BISTEN and a sum signal BISTEN_SUM. The test enable signal BISTEN may be activated for a test operation. The sum signal BISTEN_SUM may be generated by sequentially summing test enable signals BISTEN from the fourth semiconductor chip 140 serving as the uppermost chip to a corresponding semiconductor chip (for example, the first semiconductor chip 110). The sum signal BISTEN_SUM may be transferred from the upper chip to the lower chip through the through electrodes SUM_TSV1 to SUM_TSV3. The test command BIST_CMD may include a row-based test command BIST_xxx and a column-based test command BIST_yyy. The test address BIST_ADD<0:m> may include a test row address BIST_RADD<0:m> and a test column address BIST_CADD<0:m>.

Figure 2:
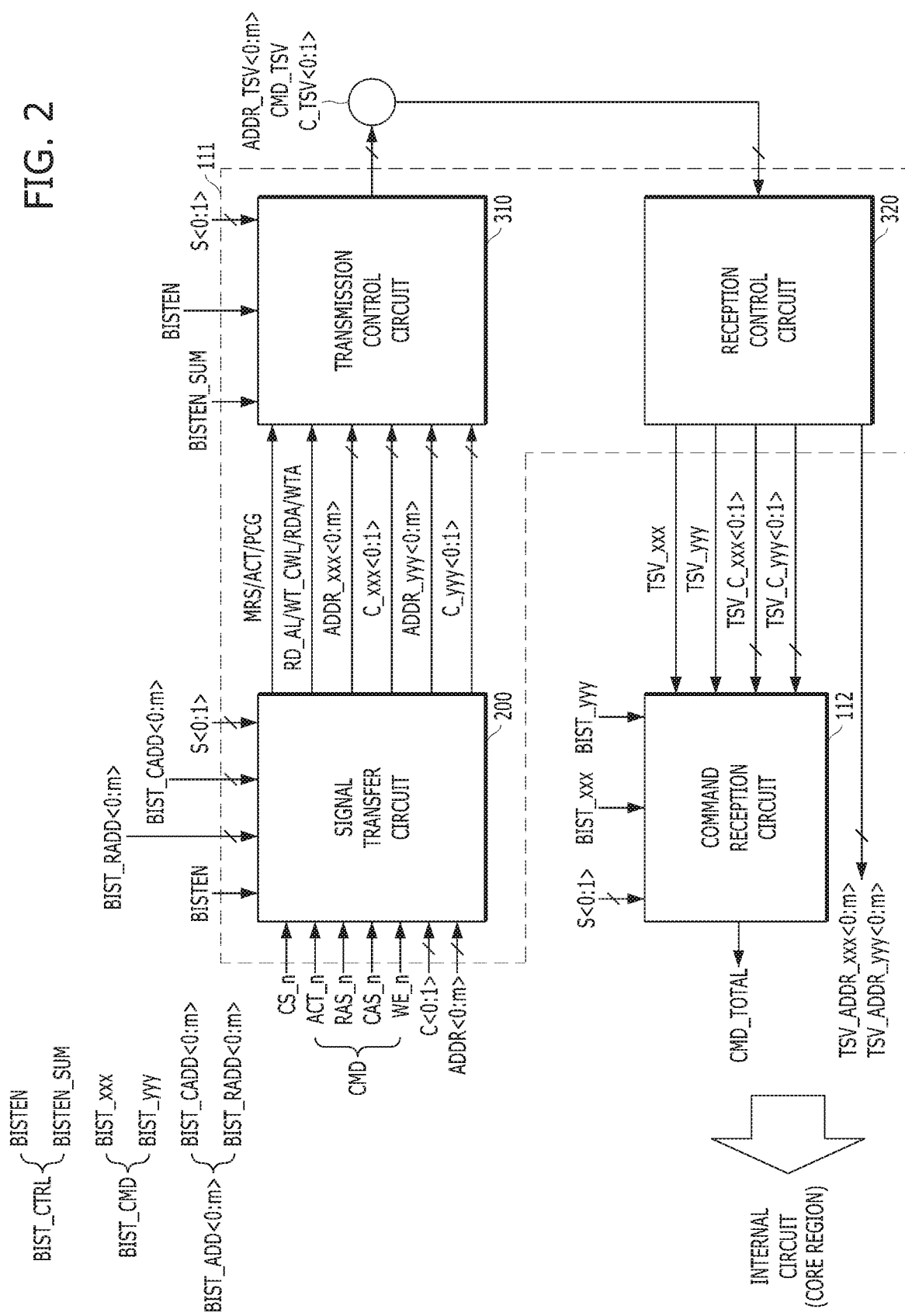
FIG. 2 is a block diagram illustrating a detailed configuration of a transceiver circuit and a command reception circuit of a first semiconductor chip of FIG. 1.

FIG. 2 is a block diagram illustrating a detailed configuration of the transceiver circuit 111 and the command reception circuit 112 of the first semiconductor chip 110 of FIG. 1.

Referring to FIG. 2, the transceiver circuit 111 may include a signal transfer circuit 200, a transmission control circuit 310, and a reception control circuit 320.

The signal transfer circuit 200 may receive the external chip select signal CS_n, the command CMD, the address ADDR<0:m>, and the chip select signal C<0:1> from the memory controller, and transfer the received signals to the first semiconductor chip 110. The command CMD may include an active signal ACT_n, a row address strobe signal RAS_n, a column address strobe signal CAS_n, and a write enable signal WE_n. The signal transfer circuit 200 may generate a row-based command and a column-based command by decoding the command CMD, add latency to the column-based command and output a delayed column-based command. The row-based command may include an MRS command MRS, an active command ACT, and a precharge command PCG, The column-based command may include a read command RD, a write command WT, a command for read with auto precharge (i.e., a read with auto precharge command) RDA, and a command for write with auto precharge (i.e., a write with auto precharge command) WTA.

The signal transfer circuit 200 may latch the address ADDR<0:m> and the chip select signal C<0:1> according to the row-based command, and output the latched address ADDR_xxx<0:m> and the latched chip select signal C_xxx<0:1>. Furthermore, the signal transfer circuit 200 may add latency to the address ADDR<0:m> and the chip select signal C<0:1>, and output the delayed address ADDR_yyy<0:m> and the delayed chip select signal C_yyy<0:1>. The reference numeral "xxx" may refer to the row-based command MRS/ACT/PCG, and the reference numeral "yyy" may refer to the column-based command RD/WT/RDA/WTA.

The signal transfer circuit 200 may multiplex the test address BIST_ADD<0:m> with the address ADD<0:m> to output a multiplexed signal according to the test enable signal BISTEN. That is, the signal transfer circuit 200 may multiplex the test row address BIST_RADD<0:m> with the latched address ADDR_xxx<0:m> to output a multiplexed signal according to the test enable signal BISTEN. Further, the signal transfer circuit 200 may multiplex the test column address BIST_CADD<0:m> with the delayed address ADDR_yyy<0:m> to output a multiplexed signal according to the test enable signal BISTEN. Furthermore, the signal transfer circuit 200 may multiplex the chip ID S<0:1> with the chip select signal C<0:1> to output a multiplexed signal according to the test enable signal BISTEN. That is, the signal transfer circuit 200 may multiplex the chip ID S<0:1> with the latched chip select signal C_xxx<0:1> to output a multiplexed signal according to the test enable signal BISTEN. Further, the signal transfer circuit 200 may multiplex the chip ID S<0:1> with the delayed chip select signal C_yyy<0:1> to output a multiplexed signal according to the test enable signal BISTEN.

The transmission control circuit 310 may control the signals, which are transferred from the signal transfer circuit 200, to be transferred to the first to third through electrodes CMD_TSV, ADDR_TSV<0:m>, and C_TSV<0:1> according to the test enable signal BISTEN and the sum signal BISTEN_SUM. In the present embodiment, during a normal operation, only the transmission control circuit 310 of the first semiconductor chip 110 may be enabled to transfer the signals, which are transferred from the signal transfer circuit 200, to the first to third through electrodes CMD_TSV, ADDR_TSV<0:m>, and C_TSV<0:1>. On the other hand, during a test operation, a transmission control circuit selected according to the test enable signal BISTEN and the sum signal BISTEN_SUM may be enabled to transfer the signals, which are transferred from the signal transfer circuit 200, to the first to third through electrodes CMD_TSV, ADDR_TSV<0:m>, and C_TSV<0:1>.

The reception control circuit 320 may control the signals, which are transferred through the first to third through electrodes CMD_TSV, ADDR_TSV<0:m>, and C_TSV<0:1>, to be received. The reception control circuit 320 may receive commands TSV_xxx and TSV_yyy, addresses TSV_ADDR_xxx<0:m> and TSV_ADDR_yyy<0:m> and chip select signals TSV_C_xxx<0:1> and TSV_C_yyy<0:1>. The commands TSV_xxx and TSV_yyy may be transferred through the first through electrodes CMD_TSV. The addresses TSV_ADDR_xxx<0:m> and TSV_ADDR_yyy<0:m> may be transferred through the second through electrodes ADDR_TSV<0:m>. The chip select signals TSV_C_xxx<0:1> and TSV_C_yyy<0:1> may be transferred through the third through electrodes C_TSV<0:1>.

The command reception circuit 112 may transfer the test commands BIST_xxx and BIST_yyy or the commands TSV_xxx and TSV_yyy to the inside of the first semiconductor chip 110 as an internal command CMD_TOTAL according to the chip select signals TSV_C_xxx<0:1> and TSV_C_yyy<0:1>. The test commands BIST_xxx and BIST_yyy are transferred from the test control circuits 114, 124, 134, and 144. The commands TSV_xxx and TSV_yyy are transferred from the reception control circuit 320. The chip select signals TSV_C_xxx<0:1> and TSV_C_yyy<0:1> are transferred from the reception control circuit 320. When the chip select signals TSV_C_xxx<0:1> and TSV_C_yyy<0:1> and the assigned chip ID S<0:1> coincide with each other by a comparison thereof, the command reception circuit 112 may transfer the commands TSV_xxx and TSV_yyy or the test commands BIST_xxx and BIST_yyy to the core area (or the internal circuit) of the semiconductor chip 110.

Figure 3:
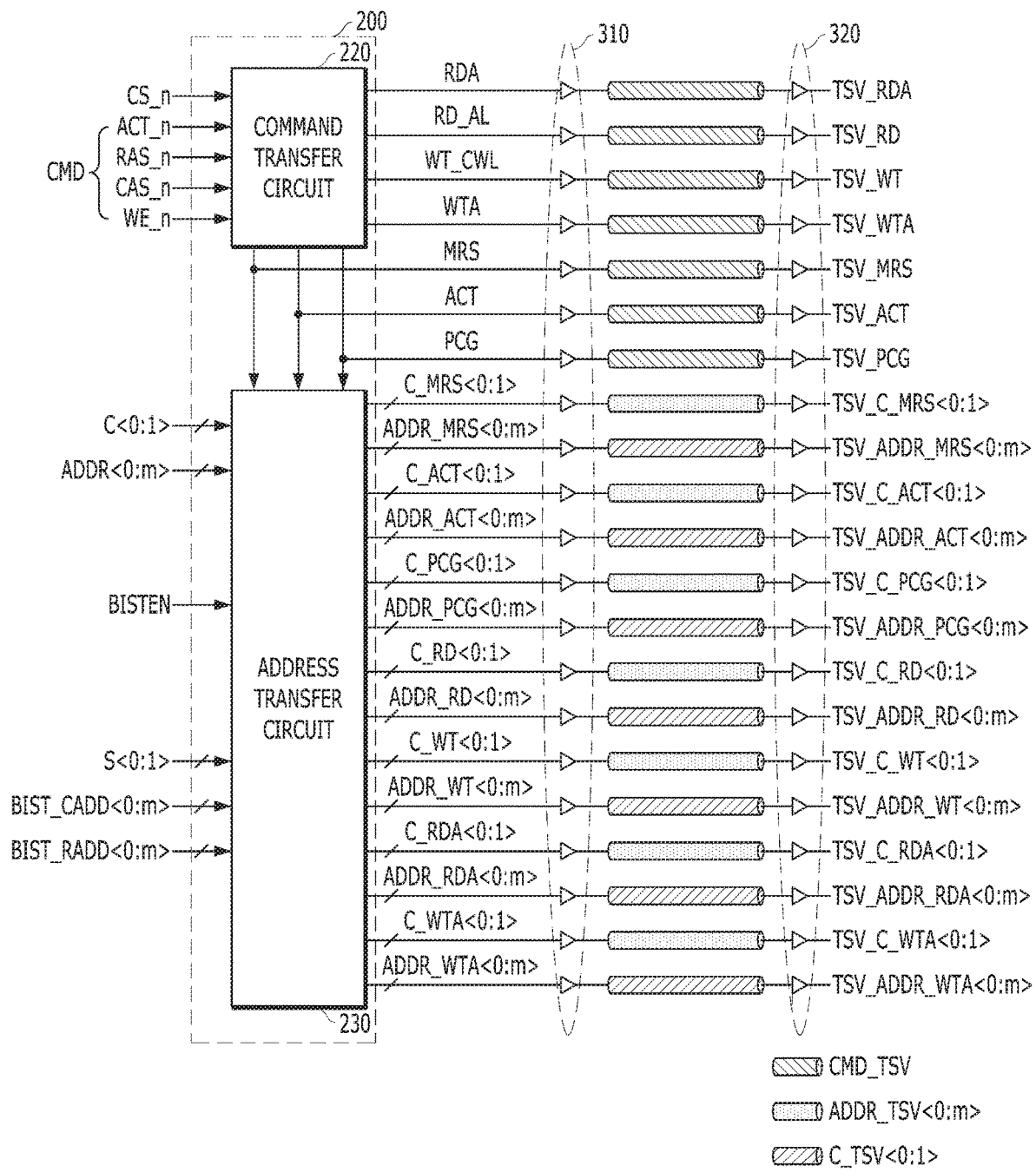
FIG. 3 is a block diagram illustrating a detailed configuration of a signal transfer circuit of FIG. 2.

FIG. 3 is a block diagram illustrating a detailed configuration of the signal transfer circuit 200 of FIG. 2. FIG. 3 schematically illustrates the transmission control circuit 310, the first to third through electrodes CMD_TSV, ADDR_TSV<0:m>, and C_TSV<0:1>, and the reception control circuit 320, in addition to the signal transfer circuit 200.

Referring to FIG. 3, the signal transfer circuit 200 may include a command transfer circuit 220 and an address transfer circuit 230.

The command transfer circuit 220 may receive the external chip select signal CS_n and the command CMD to generate the MRS command MRS, the active command ACT, the precharge command PCG, the read command RD_AL, the write command WT_CWL, the read with auto precharge command RDA, and the write with auto precharge command WTA. Further, the command transfer circuit 220 may transfer the generated commands to the transmission control circuit 310.

The transmission control circuit 310 may transfer the MRS command MRS, the active command ACT, the precharge command PCG, the read command RD_AL, the write command WT_CWL, the read with auto precharge command RDA, and the write with auto precharge command WTA to the first through electrodes CMD_TSV. The reception control circuit 320 may receive the MRS command TSV_MRS, the active command TSV_ACT, the precharge command TSV_PCG, the read command TSV_RD, the write command TSV_WT, the read with auto precharge command TSV_RDA, and the write with auto precharge command TSV_WTA transferred through the first through electrodes CMD_TSV. Detailed configurations and operations of the transmission control circuit 310 and the reception control circuit 320 are described with reference to FIG. 9.

The address transfer circuit 230 may latch the address ADDR<0:m> and the chip select signal C<0:1> according to the MRS command MRS, the active command ACT, and the precharge command PCG. Further, the address transfer circuit 230 may transfer latched addresses ADDR_MRS<0:m>, ADDR_ACT<0:m>, and ADDR_PCG<0:m> and latched chip select signals C_MRS<0:1>, C_ACT<0:1>, and C_PCG<0:1> to the transmission control circuit 310. Furthermore, the address transfer circuit 230 may add latency to the address ADDR<0:m> and the chip select signal C<0:1> and transfer delayed addresses ADDR_RD<0:m>, ADDR_WT<0:m>, ADDR_RDA<0:m>, and ADDR_WTA<0:m> and delayed chip select signals C_RD<0:1>, C_WT<0:1>, C_RDA<0:1>, and C_WTA<0:1> to the transmission control circuit 310. The address transfer circuit 230 may multiplex the test row address BIST_RADD<0:m> and the latched addresses ADDR_ACT<0:m> and ADDR_PCG<0:m> to output a multiplexed address according to the test enable signal BISTEN. Further, the address transfer circuit 230 may multiplex the test column address BIST_CADD<0:m> and the delayed address ADDR_RD<0:m> to output a multiplexed address according to the test enable signal BISTEN. Furthermore, the address transfer circuit 230 may multiplex the chip ID S<0:1>, the latched chip select signals C_ACT<0:1> and C_PCG<0:1>, and the delayed chip select signal C_RD<0:1> to output a multiplexed signal according to the test enable signal BISTEN.

The transmission control circuit 310 may transfer the addresses ADDR_MRS<0:m>, ADDR_ACT<0:m>, ADDR_PCG<0:m>, ADDR_RD<0:m>, ADDR_WT<0:m>, ADDR_RDA<0:m>, and ADDR_WTA<0:m> to the second through electrodes ADDR_TSV<0:m>. The reception control circuit 320 may receive the addresses TSV_ADDR_MRS<0:m>, TSV_ADDR_ACT<0:m>, TSV_ADDR_PCG<0:m>, TSV_ADDR_RD<0:m>, TSV_ADDR_WT<0:m>, TSV_ADDR_RDA<0:m>, and TSV_ADDR_WTA<0:m> transferred through the second through electrodes ADDR_TSV<0:m>. Similarly, the transmission control circuit 310 may transfer the chip select signals C_MRS<0:1>, C_ACT<0:1>, C_PCG<0:1>, C_RD<0:1>, C_WT<0:1>, C_RDA<0:1>, and C_WTA<0:1> to the third through electrodes C_TSV<0:1>. The reception control circuit 320 may receive the chip select signals TSV_C_MRS<0:1>, TSV_C_ACT<0:1>, TSV_C_PCG<0:1>, TSV_C_RD<0:1>, TSV_C_WT<0:1>, TSV_C_RDA<0:1>, and TSV_C_WTA<0:1> transferred through the third through electrodes C_TSV<0:1>.

Figure 4:
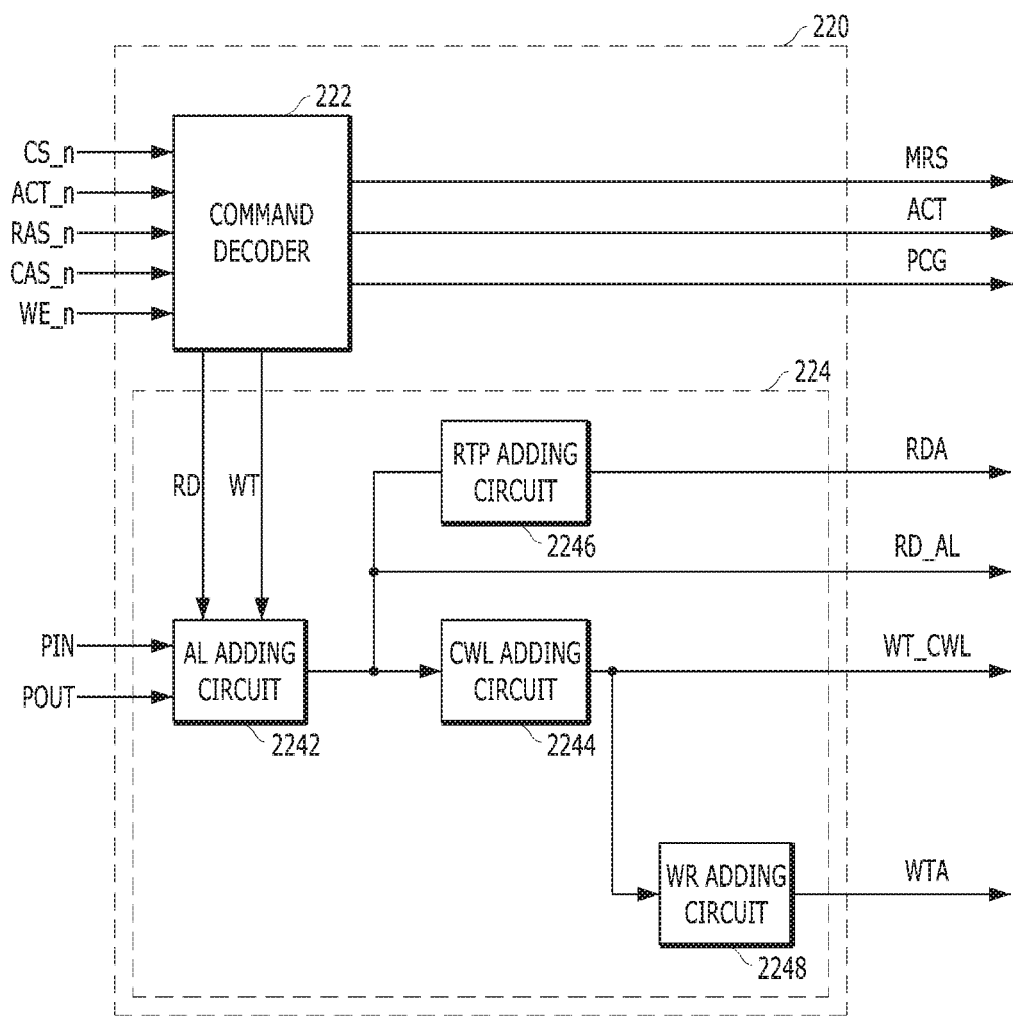
FIG. 4 is a block diagram illustrating a detailed configuration of a command transfer circuit of FIG. 3.

FIG. 4 is a block diagram illustrating a detailed configuration of the command transfer circuit 220 of FIG. 3.

Referring to FIG. 4, the command transfer circuit 220 may include a command decoder 222 and a first latency control circuit 224.

The command decoder 222 may generate the row-based command and the column-based command by decoding the external chip select signal CS_n and the command CMD (that is, the active signal ACT_n, the row address strobe signal RAS_n, the column address strobe signal CAS_n, and the write enable signal WE_n) inputted from the memory controller.

The first latency control circuit 224 may add latency to the column-based command, for example, the read command RD and the write command WT, to generate the read command RD_AL, the write command WT_CWL, the read with auto precharge command RDA, and the write with auto precharge command WTA. The read with auto precharge command RDA and the write with auto precharge command WTA perform substantially the same functions as those of the read command RD and the write command WT. However, the read with auto precharge command RDA and the write with auto precharge command WTA perform a read operation or a write operation and then automatically generate the precharge command in compliance with the latency specifications via the MRS, unlike the read command RD and the write command WT.

More specifically, the first latency control circuit 224 may include an additive latency (AL) adding circuit 2242, a column address strobe (CAS) write latency (CWL) adding circuit 2244, a read-to-precharge (RTP) adding circuit 2246, and a write recovery (WR) adding circuit 2248.

In general, in a semiconductor memory device such as a double data rate synchronous DRAM (DDR SDRAM), various operation timings are set in order to easily exchange data with an external circuit. Representatively, there is read latency (RL) or write latency (WL). The read latency (RL) defines a time required until valid data is outputted from a time point at which a read command is applied, the write latency (WL) defines a time at which data is inputted after a write command, and one cycle of an externally applied clock signal is defined as a unit time. In the case of a memory employing additive latency (AL), the read latency (RL) may be defined as the sum of the additive latency (AL) and the CAS latency (CL), and the write latency (WL) may be defined as the sum of the additive latency (AL) and the CAS write latency (CWL). In such a case, since the CAS latency (CL) is a parameter related to data input/output, the read latency (RL) of the command transfer circuit 220 may be determined according to the additive latency (AL).

The AL adding circuit 2242 may have a delay amount corresponding to the additive latency (AL). When the read command RD or the write command WT is inputted, the AL adding circuit 2242 may delay the command by the additive latency (AL) and output the delayed command as the read command RD_AL. The AL adding circuit 2242 may operate in synchronization with an input control signal PIN and an output control signal POUT. The input control signal PIN is generated by decoding the read command RD or the write command WT and may be provided from the command decoder 222, and the output control signal POUT may be generated by delaying the input control signal PIN for a set period of time.

The CWL adding circuit 2244 may have a delay amount corresponding to the CAS write latency (CWL), The CWL adding circuit 2244 may delay the read command RD_AL by the CAS write latency (CWL) and output the write command WT_CWL. The RTP adding circuit 2246 may have a delay amount corresponding to a read-to-precharge time (RTP). The RTP adding circuit 2246 may delay the read command RD_AL by the read-to-precharge time (RTP) and output the read with auto precharge command RDA. The WR adding circuit 2248 may have a delay amount corresponding to a write recovery time (tWR). The WR adding circuit 2248 may delay the write command WT_CWL by the write recovery time (tWR) and output the write with auto precharge command WTA.

Figure 5:
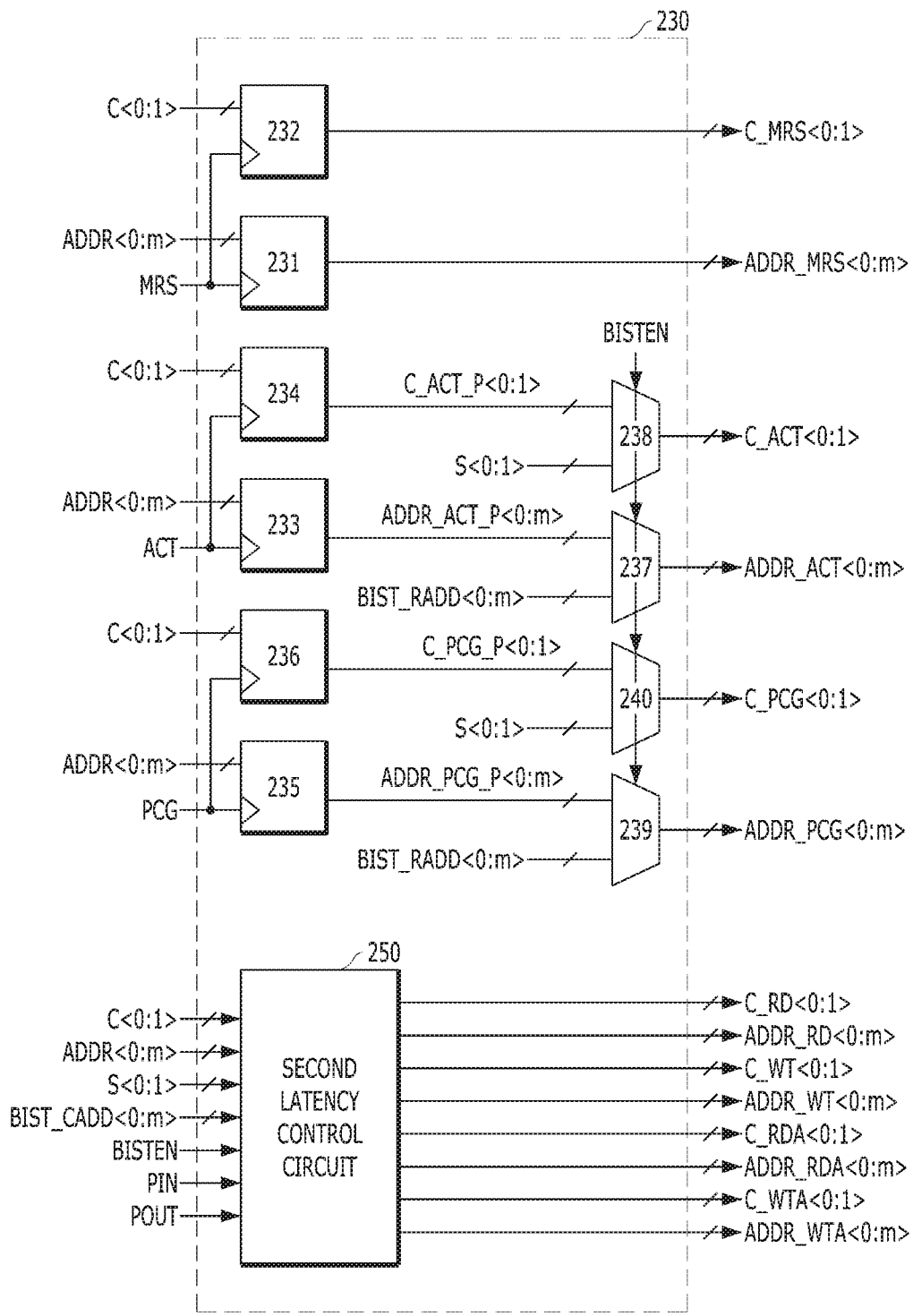
FIG. 5 is a block diagram illustrating a detailed configuration of an address transfer circuit of FIG. 3 in accordance with an embodiment of the present invention.

FIG. 5 is a block diagram illustrating a detailed configuration of the address transfer circuit 230 of FIG. 3.

Referring to FIG. 5, the address transfer circuit 230 may include a plurality of latches 231 to 236, a plurality of selectors 237 to 240, and a second latency control circuit 250.

The plurality of latches 231 to 236 may latch the address ADDR<0:m> or the chip select signal C<0:1> inputted according to the row-based command. For example, the first latch 231 and the second latch 232 may latch the address ADDR<0:m> and the chip select signal C<0:1> according to the MRS command MRS, respectively, and output the latched address ADDR_MRS<0:m> and the latched chip select signal C_MRS<0:1>. The third and fourth latches 233 and 234 may latch the address ADDR<0:m> and the chip select signal C<0:1> according to the active command ACT, respectively, and output a latched address ADDR_ACT_P<0:m> and a latched chip select signal C_ACT_P<0:1>. The fifth and sixth latches 235 and 236 may latch the address ADDR<0:m> and the chip select signal C<0:1> according to the precharge command PCG, respectively, and output a latched address ADDR_PCG_P<0:m> and a latched chip select signal C_PCG_P<0:1>.

The plurality of selectors 237 to 240 may multiplex the test row address BIST_RADD<0:m> with the latched address ADDR_xxx<0:m> to output a multiplexed signal, and multiplex the chip ID S<0:1> with the latched chip select signal C_xxx<0:1> to output a multiplexed signal, according to the test enable signal BISTEN. For example, the first selector 237 may select one of the test row address BIST_RADD<0:m> and the latched address ADDR_ACT_P<0:m> to output the latched address ADDR_ACT<0:m> according to the test enable signal BISTEN. Preferably, when the test enable signal BISTEN is activated, the first selector 237 may select the test row address BIST_RADD<0:m> and output the latched address ADDR_ACT<0:m>. The second selector 238 may select one of the chip ID S<0:1> and the latched chip select signal C_ACT_P<0:1> to output the latched chip select signal C_ACT<0:1> according to the test enable signal BISTEN. Similarly, the third selector 239 may select one of the test row address BIST_RADD<0:m> and the latched address ADDR_PCG_P<0:m> to output the latched address ADDR_PCG<0:m> according to the test enable signal BISTEN. The fourth selector 240 may select one of the chip ID S<0:1> and the latched chip select signal C_PCG_P<0:1> to output the latched chip select signal C_PCG<0:1> according to the test enable signal BISTEN. Since the MRS command MRS is transferred to all the semiconductor chips during the test operation, the test row address BIST_RADD<0:m> and the chip ID S<0:1> corresponding to the MRS command MRS are not multiplexed with the address ADDR_MRS<0:m> and the chip select signal C_MRS<0:1>.

The second latency control circuit 250 may add latency to the address ADDR<0:m> to output the delayed addresses ADDR_RD<0:m>, ADDR_WT<0:m>, ADDR_RDA<0:m>, and ADDR_WTA<0:m>. Furthermore, the second latency control circuit 250 may add latency to the chip select signal C<0:1> to output the delayed chip select signals C_RD<0:1>, C_WT<0:1>, C_RDA<0:1>, and C_WTA<0:1>. In the present embodiment, the second latency control circuit 250 may multiplex the test column address BIST_CADD<0:m> with the delayed address ADDR_RD<0:m> to output a multiplexed address, and multiplex the chip ID S<0:1> with the delayed chip select signal C_RD<0:1> to output a multiplexed signal, according to the test enable signal BISTEN.

Figure 6:
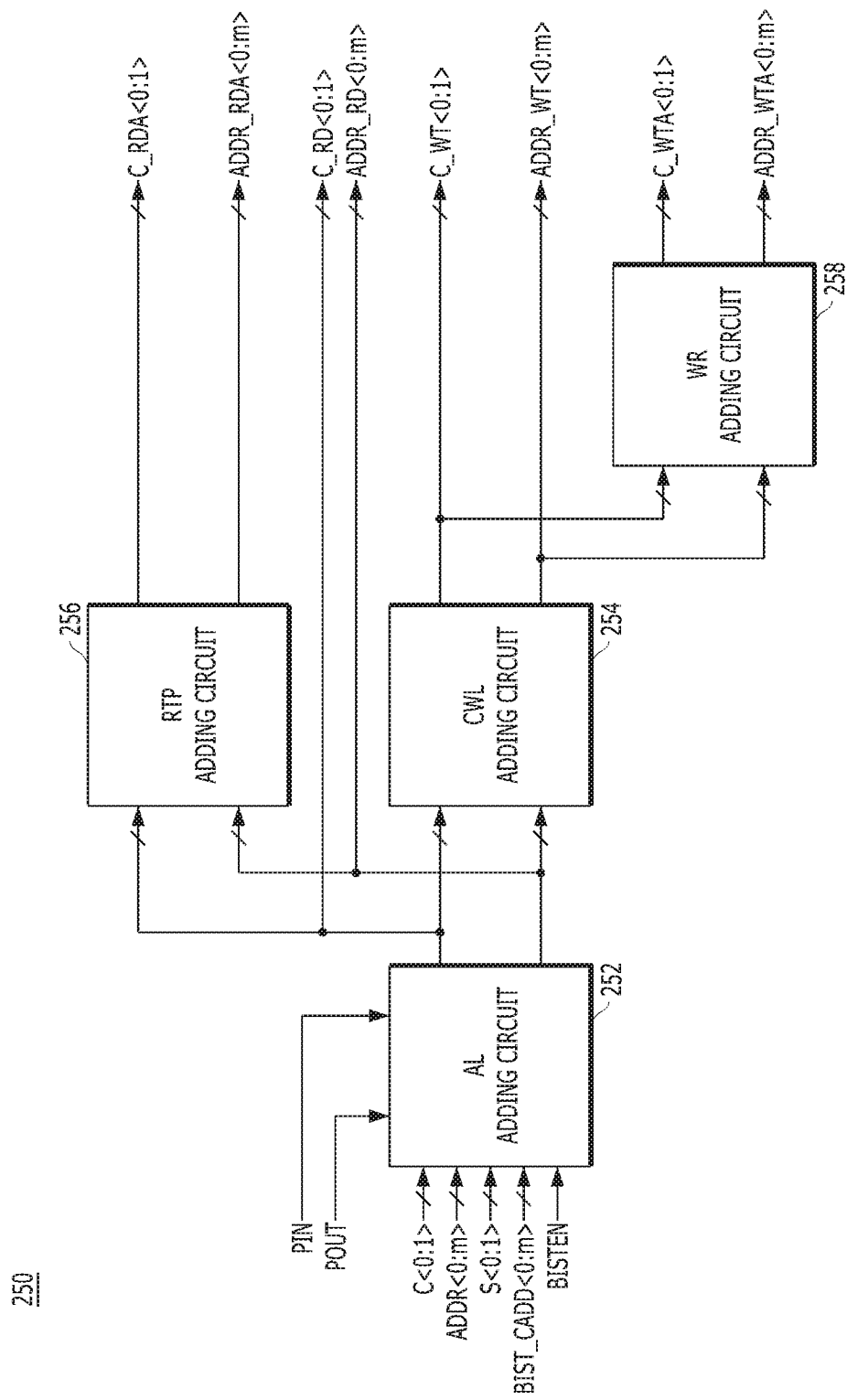
FIG. 6 is a block diagram illustrating a detailed configuration of a second latency control circuit of FIG. 5.

FIG. 6 is a block diagram illustrating a detailed configuration of the second latency control circuit 250 of FIG. 5.

Referring to FIG. 6, the second latency control circuit 250 may include an additive latency (AL) adding circuit 252, a CAS write latency (CWL) adding circuit 254, a read-to-precharge (RTP) adding circuit 256, and a write recovery (WR) adding circuit 258.

The AL adding circuit 252 may have a delay amount corresponding to the additive latency (AL). The AL adding circuit 252 may delay the address ADDR<0:m> and the chip select signal C<0:1> by the additive latency (AL), respectively, and output the delayed address ADDR_RD<0:m> and the delayed chip select signal C_RD<0:1>. The AL adding circuit 252 may operate in synchronization with the input control signal PIN and the output control signal POUT. Furthermore, in the present embodiment, the AL adding circuit 252 may output the test column address BIST_CADD<0:m> as the delayed address ADDR_RD<0:m> and output the chip ID S<0:1> as the delayed chip select signal C_RD<0:1> according to the test enable signal BISTEN.

The CWL adding circuit 254 may have a delay amount corresponding to the CAS write latency (CWL). The CWL adding circuit 254 may delay the delayed address ADDR_RD<0:m> and the delayed chip select signal C_RD<0:1> by the CAS write latency (CWL) and output the delayed address ADDR_WT<0:m> and the delayed chip select signal C_WT<0:1>.

The RTP adding circuit 256 may have a delay amount corresponding to the read-to-precharge time (RTP). The RTP adding circuit 256 may delay the delayed address ADDR_RD<0:m> and the delayed chip select signal C_RD<0:1> by the read-to-precharge time (RTP) and output the delayed address ADDR_RDA<0:m> and the delayed chip select signal C_RDA<0:1>.

The WR adding circuit 258 may have a delay amount corresponding to the write recovery time (tWR). The WR adding circuit 258 may delay the delayed address ADDR_WT<0:m> and the delayed chip select signal C_WT<0:1> by the write recovery time (tWR) and output the delayed address ADDR_WTA<0:m> and the delayed chip select signal C_WTA<0:1>.

Figure 7:
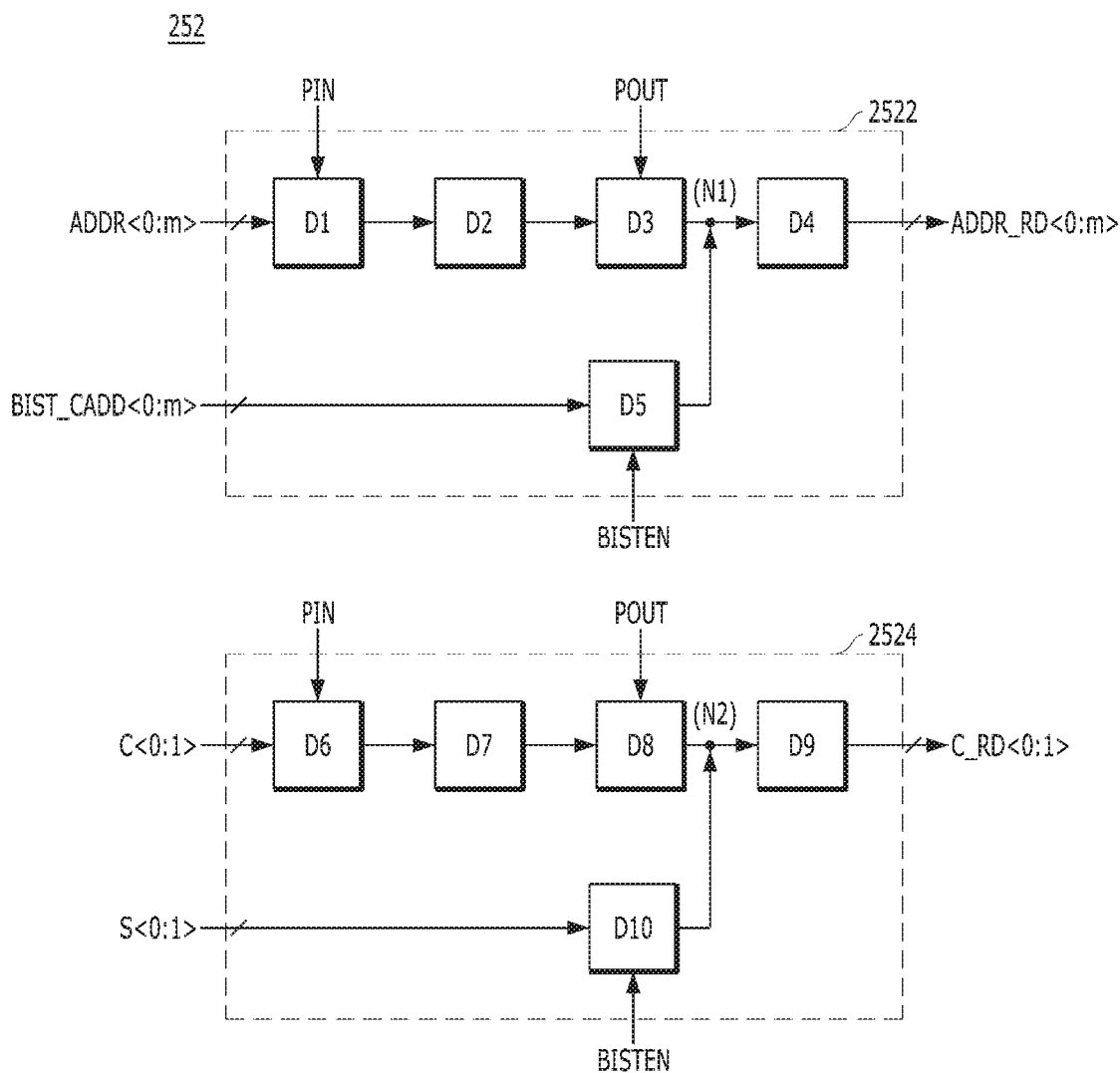
FIG. 7 is a circuit diagram of an AL adding circuit of FIG. 6.

FIG. 7 is a circuit diagram of the AL adding circuit 252 of FIG. 6.

Referring to FIG. 7, the AL adding circuit 252 may include a first multiplexing circuit 2522 and a second multiplexing circuit 2524.

The first multiplexing circuit 2522 may include a plurality of delay elements D1 to D5 each having a delay amount corresponding to the additive latency (AL). For example, the first multiplexing circuit 2522 may include first to fourth delay elements D1 to D4 for delaying the address ADDR<0:m> and outputting the delayed address ADDR_RD<0:m>. Preferably, the first delay element D1 may be enabled according to the input control signal PIN and the third delay element D3 may be enabled according to the output control signal POUT. Furthermore, the first multiplexing circuit 2522 may include a fifth delay element D5 which may be enabled according to the test enable signal BISTEN and may delay the test column address BIST_CADD<0:m>. The fifth delay element D5 may receive the test column address BIST_CADD<0:m> and output the test column address BIST_CADD<0:m> to a common node N1 of the third and fourth delay elements D3 and D4, so that the test column address BIST_CADD<0:m> is outputted as the delayed address ADDR_RD<0:m>. Preferably, each of the first to fifth delay elements D1 to D5 may be configured as a cross-coupled inverter latch, and delay amounts of the first to fifth delay elements D1 to D5 may be substantially equal to one another.

The second multiplexing circuit 2524 may have substantially the same configuration as that of the first multiplexing circuit 2522. The second multiplexing circuit 2524 may include a plurality of delay elements D6 to D10 each having a delay amount corresponding to the additive latency (AL). For example, the second multiplexing circuit 2524 may include sixth to ninth delay elements D6 to D9 for delaying the chip select signal C<0:1> and outputting the delayed chip select signal C_RD<0:1>, and a tenth delay element D10 which may be enabled according to the test enable signal BISTEN and may delay the chip ID S<0:1>. The tenth delay element D10 may receive the chip ID S<0:1> and output the chip ID S<0:1> to a common node N2 of the eighth and ninth delay elements D8 and D9, so that the chip ID S<0:1> is outputted as the delayed chip select signal C_RD<0:1>.

With the aforementioned configuration, during the normal operation, the AL adding circuit 252 may delay the address ADDR<0:m> and the chip select signal C<0:1> by the additive latency (AL) and output the delayed address ADDR_RD<0:m> and the delayed chip select signal C_RD<0:1>. On the other hand, during the test operation, the AL adding circuit 252 may output the test column address BIST_CADD<0:m> and the chip ID S<0:1> as the delayed address ADDR_RD<0:m> and the delayed chip select signal C_RD<0:1>.

Figure 8:
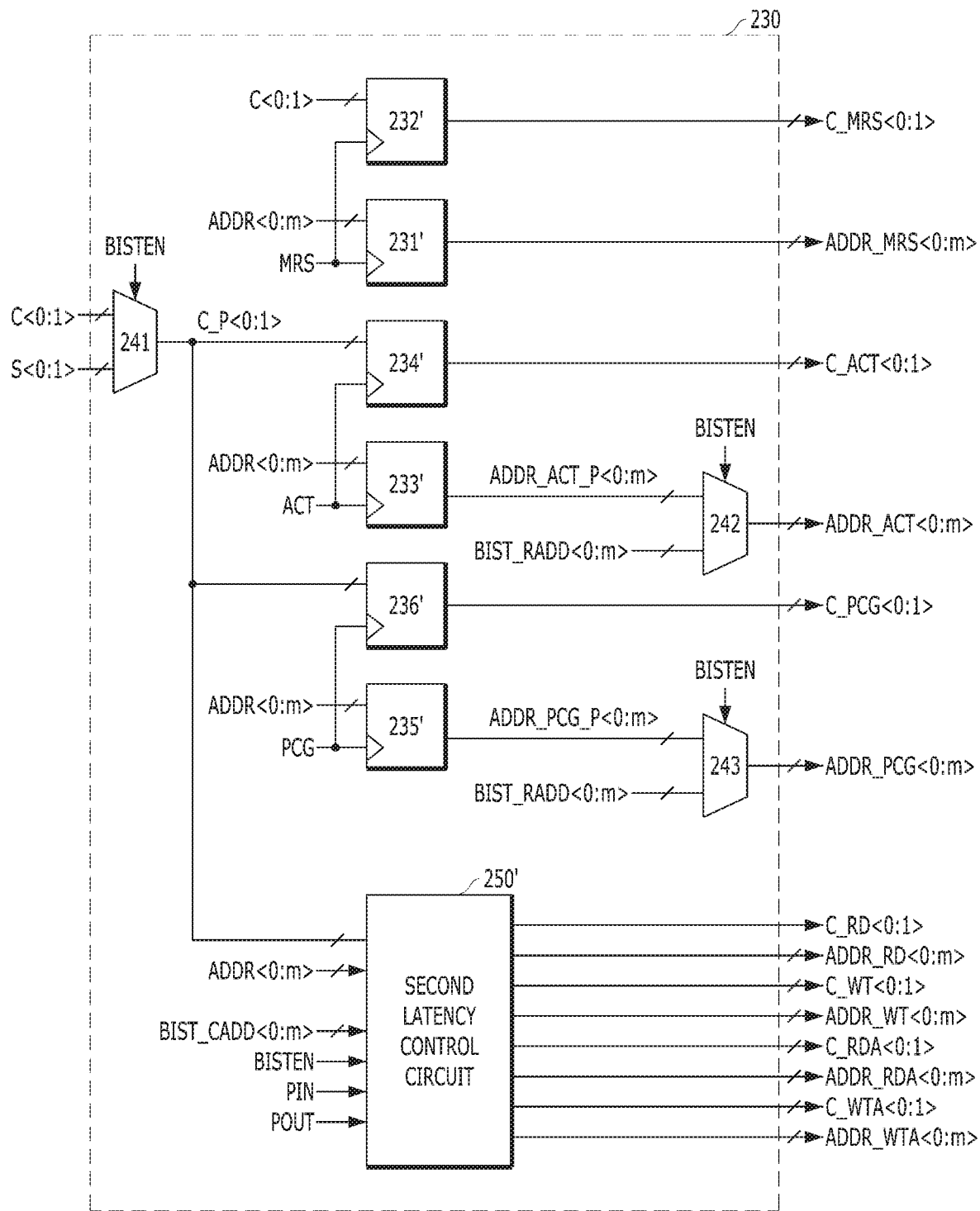
FIG. 8 is a block diagram illustrating a detailed configuration of an address transfer circuit of FIG. 3 in accordance with another embodiment of the present invention.

FIG. 8 is a block diagram illustrating a detailed configuration of the address transfer circuit 230 of FIG. 3 in accordance with another embodiment of the present invention.

Referring to FIG. 8, the address transfer circuit 230 may include first to third selectors 241 to 243, first to sixth latches 231' to 236', and a second latency control circuit 250'.

The first selector 241 may multiplex the chip ID S<0:1> and the chip select signal C<0:1> to output a chip select signal C_P<0:1> according to the test enable signal BISTEN. For example, the first selector 241 may select one of the chip ID 5<0:1> and the chip select signal C<0:1> to output the chip select signal C_P<0:1> according to the test enable signal BISTEN.

The first to sixth latches 231' to 236' may latch the address ADDR<0:m> or the chip select signal C<0:1> inputted according to the row-based command. The first to sixth latches 231' to 236' of FIG. 8 may have substantially the same configurations as those of the first to sixth latches 231 to 236 of FIG. 5.

The second selector 242 may select one of the test row address BIST_RADD<0:m> and the latched address ADDR_ACT_P<0:m> to output the latched address ADDR_ACT<0:m> according to the test enable signal BISTEN. The third selector 243 may select one of the test row address BIST_RADD<0:m> and the latched address ADDR_PCG_P<0:m> to output the latched address ADDR_PCG<0:m> according to the test enable signal BISTEN.

The second latency control circuit 250' may add latency to the address ADDR<0:m> to output the delayed addresses ADDR_RD<0:m>, ADDR_WT<0:m>, ADDR_RDA<0:m>, and ADDR_WTA<0:m>. Furthermore, the second latency control circuit 250' may add latency to the chip select signal C_P<0:1> to output the delayed chip select signals C_RD<0:1>, C_WT<0:1>, C_RDA<0:1>, and C_WTA<0:1>. In the present embodiment, the second latency control circuit 250' may multiplex the test column address BIST_CADD<0:m> with the delayed address ADDR_RD<0:m> to output a multiplexed address according to the test enable signal BISTEN. The second latency control circuit 250' of FIG. 8 may include the AL adding circuit 252, the CWL adding circuit 254, the RTP adding circuit 256, and the WR adding circuit 258 of FIG. 6. In such a case, the AL adding circuit of the second latency control circuit 250' may be configured to include only the first multiplexing circuit 2522 in the configuration of FIG. 7.

As described above, in the address transfer circuit 230 in accordance with another embodiment, the selector is disposed in front of the latches, so that it is possible to additionally reduce an increase in an area due to the BIST.

Figure 9:
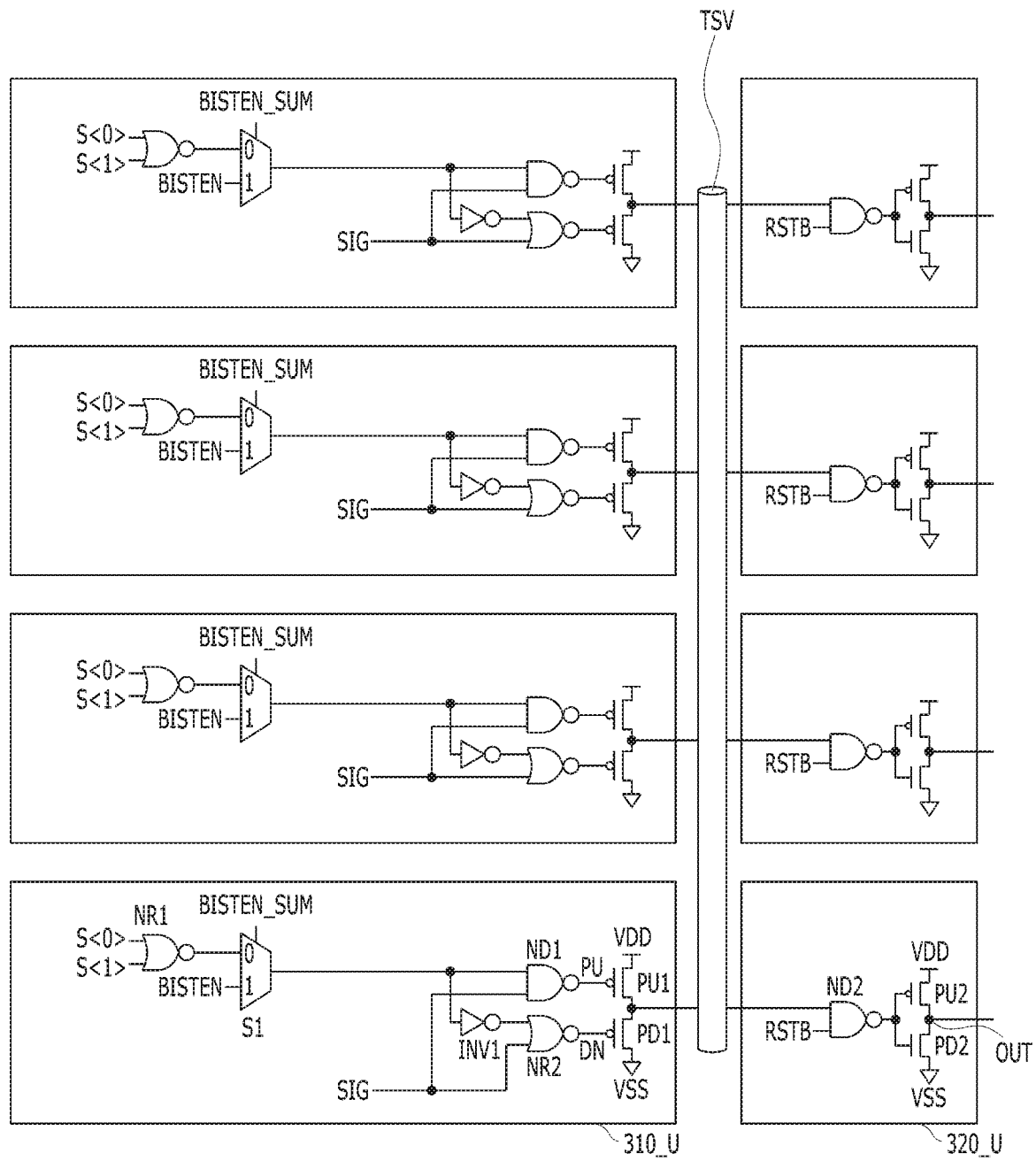
FIG. 9 is a detailed circuit diagram of a transmission control circuit and a reception control circuit of FIG. 2.

FIG. 9 is a detailed circuit diagram of the transmission control circuit 310 and the reception control circuit 320 of FIG. 2. For convenience, FIG. 9 illustrates transmission control circuits 310_U and reception control circuits 320_U of the first to fourth semiconductor chips 110, 120, 130, and 140 for driving one through electrode TSV.

Referring to FIG. 9, during the normal operation in which the test enable signal BISTEN and the sum signal BISTEN_SUM are not activated, the transmission control circuit 310_U may be activated only when the chip ID S<0:1> is "00" and transfer an input signal SIG to the through electrode TSV. On the other hand, during the test operation in which the test enable signal BISTEN and the sum signal BISTEN_SUM are activated, the transmission control circuit 310_U may be enabled regardless of the chip ID S<0:1> and may output the input signal SIG to the through electrode TSV. The reception control circuit 320_U may buffer the signal transferred through the through electrode TSV and transfer the buffered signal to a core area inside a corresponding semiconductor chip. Preferably, the reception control circuit 320_U may transfer the signal, which is transferred through the through electrode TSV in a period in which a reset signal RSTB is deactivated, to the core area inside the corresponding semiconductor chip. The reset signal RSTB is a signal that is activated to a logic low level.

More specifically, the transmission control circuit 310_U may include first and second NOR gates NR1 and NR2, a selector S1, an inverter INV1, a first NAND gate ND1, a first pull-up transistor PU1, and a first pull-down transistor PD1.

The first NOR gate NR1 may generate a transfer control signal TX_EN by performing a logic NOR operation on each bit of the chip ID S<0:1>. That is, the first NOR gate NR1 may generate a signal that is activated to a logic high level when the chip ID S<0:1> is "00". The selector S1 may select the first NOR gate NR1 or the test enable signal BISTEN according to the sum signal BISTEN_SUM, and output the transfer control signal TX_EN. For example, when the sum signal BISTEN_SUM is activated to a logic high level, the selector S1 may select the test enable signal BISTEN and output the transfer control signal TX_EN. The first NAND gate ND1 may generate a pull-up driving signal UP by performing a logic NAND operation on the transfer control signal TX_EN and the input signal SIG. The second NOR gate NR2 may generate a pull-down driving signal DN by performing a logic NOR operation on a transfer control signal inverted through the inverter INV1 and the input signal SIG. The first pull-up transistor PU1 and the first pull-down transistor PD1 may drive the through electrode TSV according to the pull-up driving signal UP and the pull-down driving signal DN.

The reception control circuit 320_U may include a second NAND gate ND2, a second pull-up transistor PU2, and a second pull-down transistor PD2. The second NAND gate ND2 may perform a logic NAND operation on the signal transferred through the through electrode TSV and the reset signal RSTB. The second pull-up transistor PU2 and the second pull-down transistor PD2 may drive an output node OUT according to the output of the second NAND gate ND2.

Figure 10:
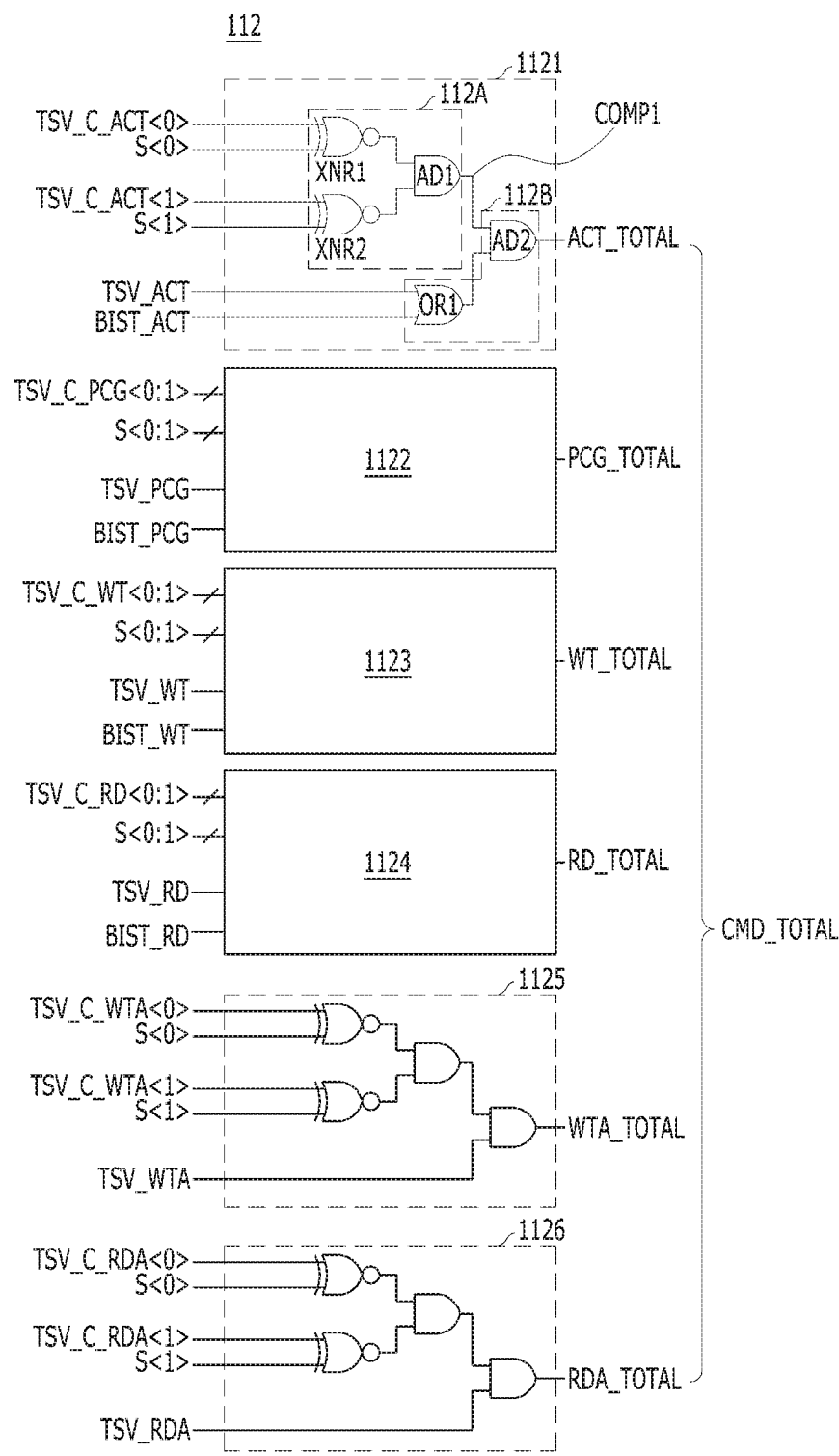
FIG. 10 is a detailed circuit diagram of a command reception circuit of FIG. 2.

FIG. 10 is a circuit diagram illustrating a configuration of the command reception circuit 112 of FIG. 2.

In FIG. 10, reference numerals "TSV_C_ACT<0:1>" and "TSV_C_PCG<0:1>" may correspond to the chip select signal TSV_C_xxx<0:1> transferred from the reception control circuit 320 of FIG. 2. Further, reference numerals "TSV_C_WT<0:1>" "TSV_C_RD<0:1>", "TSV_C_RDA<0:1>", and "TSV_C_WTA<0:1>" may correspond to the chip select signal TSV_C_yyy<0:1> transferred from the reception control circuit 320 of FIG. 2. Furthermore, reference numerals "TSV_ACT" and "TSV_PCG" may correspond to the command TSV_xxx transferred from the reception control circuit 320, and reference numerals "TSV_WT", "TSV_RD", "TSV_RDA", and "TSV_WTA" may correspond to the command TSV_yyy transferred from the reception control circuit 320 of FIG. 2. Furthermore, reference numerals "BIST_ACT" and "GIST_PCG" may correspond to the test command BIST_xxx transferred from the reception control circuit 320, and reference numerals "BIST_WT" and "BIST_RD" may correspond to the test command BIST_yyy transferred from the reception control circuit 320.

The command reception circuit 112 may include first to sixth transfer circuits 1121 to 1126. Since the first to fourth transfer circuits 1121 to 1124 have substantially the same configuration, the first transfer circuit 1121 will be representatively described.

The first transfer circuit 1121 may include a comparison circuit 112A and an output circuit 112B.

The comparison circuit 112A may compare bits of the chip select signal TSV_C_ACT<0:1> with bits of the assigned chip ID S<0:1>, and output a logic high level comparison result COMP1 when the bits of the chip select signal TSV_C_ACT<0:1> and the bits of the assigned chip ID S<0:1> coincide with each other. More specifically, the comparison circuit 112A may include first and second XNOR gates XNR1 and XNR2 and a first AND gate AD1, The first and second XNOR gates XNR1 and XNR2 perform a logic exclusive NOR operation on the bits of the chip select signal TSV_C_ACT<0:1> and the bits of the assigned chip ID S<0:1>. The first AND gate AD1 perform a logic AND operation on the output of the first XNOR gate XNR1 and the output of the second XNOR gate XNR2.

The output circuit 112B may transfer the command TSV_ACT or the test command BIST_ACT as an internal command ACT_TOTAL according to the comparison result COMP1. When the logic high level comparison result COMP1 is inputted, the output circuit 112B may output the command TSV_ACT or the test command BIST_ACT as the internal command ACT_TOTAL. More specifically, the output circuit is 112B may include an OR gate OR1 and a second AND gate AD2. The OR gate OR1 performs a logic OR operation on the command TSV_ACT or the test command BIST_ACT. The second AND gate AD2 performs a logic AND operation on the comparison result COMP1 and the output of the OR gate OR1.

During the test operation, no test commands corresponding to the read with auto precharge command RDA and the write with auto precharge command WTA are generated. Accordingly, the fifth and sixth transfer circuits 1125 and 1126 may have a configuration similar to that of the first transfer circuit 1121, except that the OR gate OR1 is omitted.

With the aforementioned configuration, when the chip select signals TSV_C_xxx<0:1> and TSV_C_yyy<0:1> and the assigned chip ID S<0:1> coincide with each other by a comparison thereof, the command reception circuit 112 may transfer the commands TSV_xxx and TSV_yyy transferred through the first through electrodes CMD_TSV or the test commands BIST_xxx and BIST_yyy generated in the internal test control circuit 114 to the core area (or the internal circuit) of the first semiconductor chip 110. During the test operation, since the chip ID S<0:1> is multiplexed with the chip select signals TSV_C_xxx<0:1> and TSV_C_yyy<0: 1> and is transferred, the command reception circuit 112 may transfer the test commands BIST_xxx and BIST_yyy to the core area (or the internal circuit) of the first semiconductor chip 110. The command reception circuit 112 compares the chip select signal and the chip ID with each other and then finally transfers the command or the test command as the internal command CMD_TOTAL according to the comparison result COMP1, so that it is possible to improve a timing bottle neck due to the comparison operation.

Figure 11:
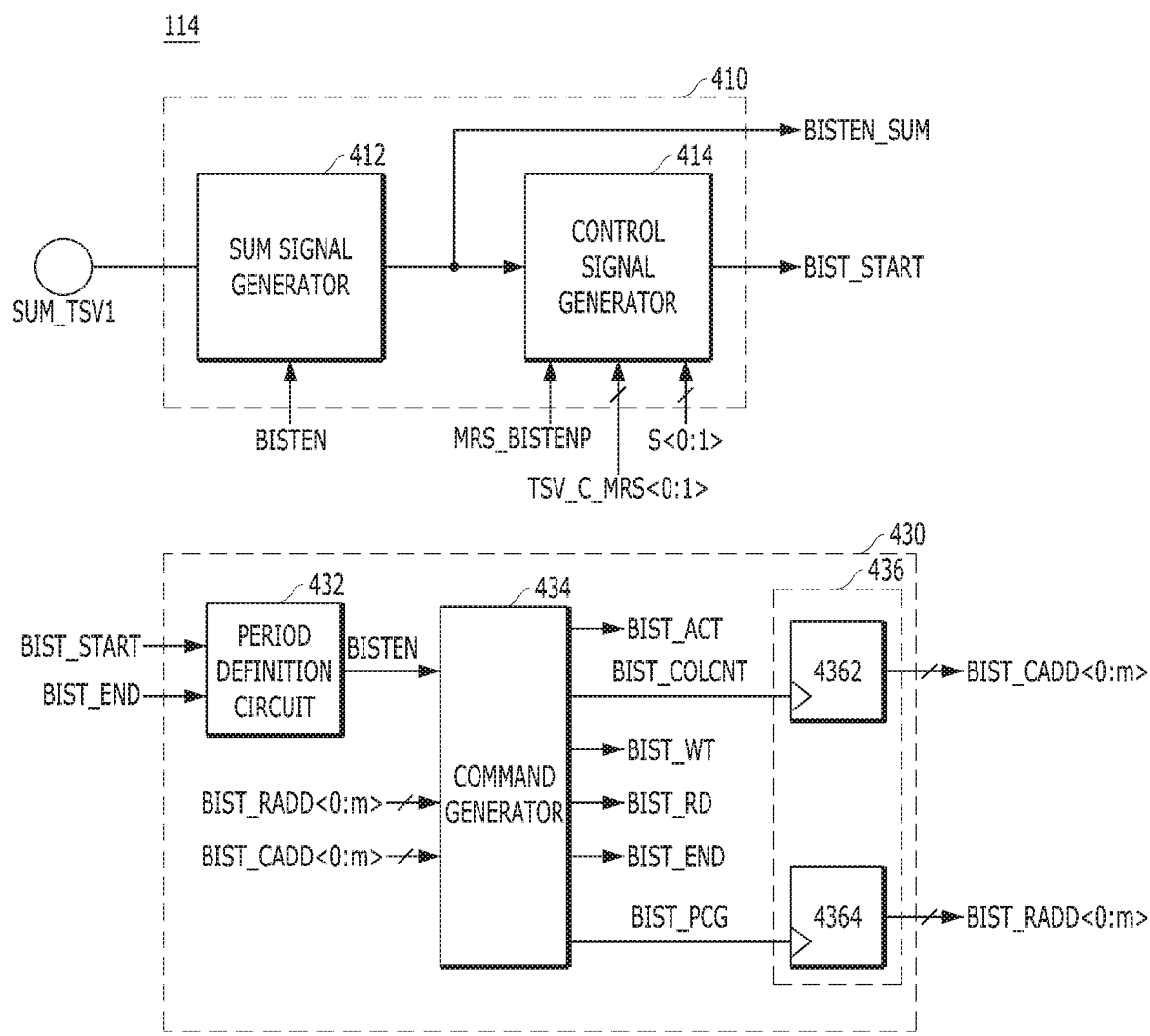
FIG. 11 is a block diagram illustrating a detailed configuration of a test control circuit of the first semiconductor chip of FIG. 1.

FIG. 11 is a block diagram illustrating a detailed configuration of the test control circuit 114 of the first semiconductor chip 110.

Referring to FIG. 11, the test control circuit 114 may include a control signal generation circuit 410 and a command/address generation circuit 430.

The control signal generation circuit 410 may generate the sum signal BISTEN_SUM by summing the sum signal transferred from the second semiconductor chip 120 through the fourth through electrode SUM_TSV1 and the test enable signal BISTEN of a corresponding semiconductor chip, that is, the first semiconductor chip 110. Furthermore, the control signal generation circuit 410 may activate a test start signal BIST_START according to the deactivation of the sum signal BISTEN_SUM. The test start signal BIST_START may be a signal that pulses immediately before a test period to inform the start of the test operation. More specifically, the control signal generation circuit 410 may include a sum signal generator 412 and a control signal generator 414.

The sum signal generator 412 may generate the sum signal BISTEN_SUM of the first semiconductor chip 110 according to the sum is signal transferred from an upper chip, that is, the second semiconductor chip 120 through the fourth through electrode SUM_TSV1 and the test enable signal BISTEN of the corresponding semiconductor chip, that is, the first semiconductor chip 110. The sum signal generator 412 may generate the sum signal BISTEN_SUM that is activated when either the sum signal transferred from the second semiconductor chip 120 or the test enable signal BISTEN is activated. That is, the sum signal BISTEN_SUM of the first semiconductor chip 110 may be generated by sequentially summing the test enable signals BISTEN from the fourth semiconductor chip 140 as the uppermost chip to the first semiconductor chip 110 as the lowermost chip.

The control signal generator 414 may activate the test start signal BIST_START by comparing a counting signal (not illustrated), which is generated by counting the deactivation of the sum signal BISTEN_SUM or the activation of an MRS pulse signal MRS_BISTENP, with the chip ID S<0:1>. Furthermore, the control signal generator 414 may generate the test start signal BIST_START according to the MRS pulse signal MRS_BISTENP and the chip select signal TSV_C_MRS<0:1>, regardless of the sum signal BISTEN_ SUM. The MRS pulse signal MRS_BISTENP may be a signal that pulses for a set period when the MRS command TSV_MRS for the BIST is inputted through the first through electrode CMD_TSV.

The command/address generation circuit 430 may activate the test enable signal BISTEN according to the test start signal BIST_START. Furthermore, the command/address generation circuit 430 may generate the test commands BIST_xxx and BIST_yyy according to the test enable signal BISTEN, and generate the test addresses BIST_RADD<0:m> and BISTCADD<0:m> that sequentially increase. More specifically, the command/address generation circuit 430 may include a period definition circuit 432, a command generator 434, and an address generator 436.

The period definition circuit 432 may generate the test enable signal BISTEN that is activated according to the test start signal BIST_START and is deactivated according to a test end signal BIST_END. The period definition circuit 432 may be implemented by an SR latch that receives the test start signal BIST_START as a set signal and receives the test end signal BIST_END as a reset signal.

The command generator 434 may generate the test commands BIST_xxx and BIST_yyy in a set order according to the test enable signal BISTEN. The test command BIST_xxx is a row-based command and may include the active command BIST_ACT and the precharge command BIST_PCG. The test command BIST_yyy is a column-based command and may include the read command BIST_RD and the write command BIST_WT. Furthermore, the command generator 434 may generate a column counting signal BIST_COLCNT that sequentially increases, and generate the test end signal BIST_END that is activated when the test row address BIST_RADD<0:m> and the test column address BIST_CADD<0:m> reach a maximum value.

The address generator 436 may include a first counter 4362 that increases the test column address BIST_CADD<0:m> according to the column counting signal BIST_COLCNT, and a second counter 4364 that increases the test row address BIST_RADD<0:m> according to the precharge command BIST_PCG.

With the aforementioned configuration, the command/address generation circuit 430 may repeatedly generate the active command BIST_ACT, the write command BIST_WT, and the precharge command BIST_PCG according to the test start signal BIST_START. When the test row address BIST_RADD<0:m> reaches the maximum value, the command/address generation circuit 430 may increase the test column address BIST_CADD<0:m> by activating the column counting signal BIST_COLCNT. When the aforementioned operation is repeated and thus the test column address BIST_CADD<0:m> also reaches the maximum value, the command/address generation circuit 430 may repeatedly generate the active command BIST_ACT, the read command BIST_RD, and the precharge command BIST_PCG, thereby allowing data written in the memory cell area of the core area to be read and controlling a test to be performed.

Figure 12:
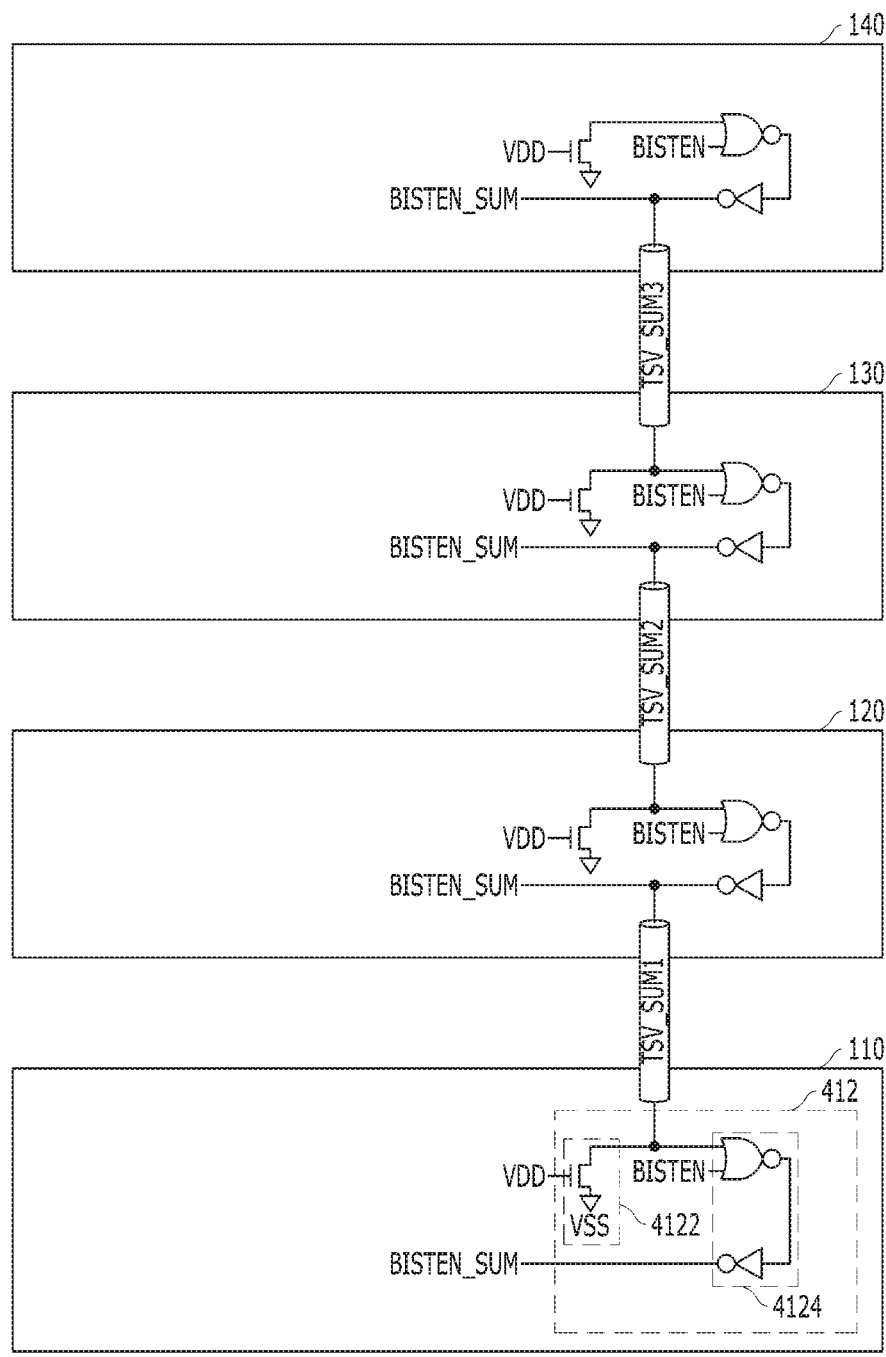
FIG. 12 is a detailed circuit diagram of a sum signal generation circuit of FIG. 11.

FIG. 12 is a detailed circuit diagram of the sum signal generator 412 of FIG. 11. For clarity, FIG. 12 illustrates the sum signal generators of the first to fourth semiconductor chips 110, 120, 130, and 140. Since the sum signal generators have substantially the same configuration, the sum signal generator 412 of the first semiconductor chip 110 will be representatively described.

Referring to FIG. 12, the sum signal generator 412 may include a node driving circuit 4122 and a sum circuit 4124.

The node driving generator 4122 may be composed of a transistor that is electrically coupled between a first node N1, to which the sum signal transferred from the second semiconductor chip 120 is inputted, and a ground voltage (VSS) terminal and receives a power supply voltage VDD through a gate thereof. Preferably, the transistor may be an NMOS transistor. That is, the node driving circuit 4122 may drive the first node N1 with the power supply voltage VDD when the sum signal transferred from the second semiconductor chip 120 is at a logic high level, and drive the first node N1 with the ground voltage VSS when the sum signal transferred from the second semiconductor chip 120 is at a logic low level.

The sum circuit 4124 may generate the sum signal BISTEN_SUM by summing a signal of the first node N1 and the test enable signal BISTEN. The sum circuit 4124 may be implemented by a NOR gate, which performs a logic NOR operation on the signal of the first node N1 and the test enable signal BISTEN, and an inverter.

The sum signal generator of the uppermost chip, that is, the fourth semiconductor chip 140, may generate the sum signal BISTEN_SUM according to the test enable signal BISTEN, and transfer the sum signal BISTEN_SUM to the third semiconductor chip 130 through the fourth through electrode SUM_TSV3.

As described above, the sum signal generator 412 may generate the sum signal BISTEN_SUM that is activated when either the sum signal BISTEN_SUM from an upper chip or the test enable signal BISTEN is activated.

Figure 13:
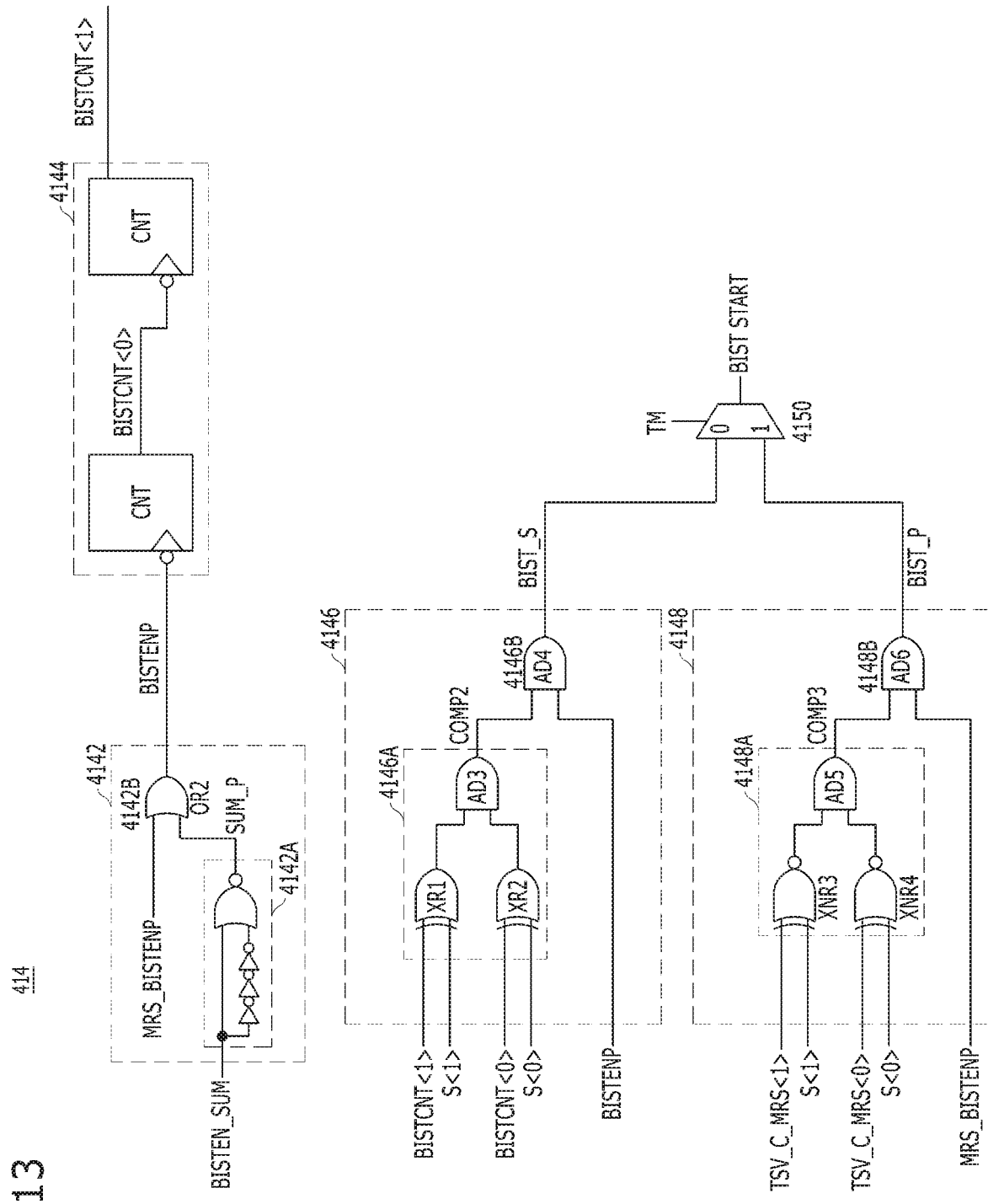
FIG. 13 is a detailed circuit diagram of a control signal generator of FIG. 11.

FIG. 13 is a detailed circuit diagram of the control signal generator 414 of FIG. 11.

Referring to FIG. 13, the control signal generator 414 may include a pulse generation circuit 4142, a counting circuit 4144, a first signal output circuit 4146, a second signal output circuit 4148, and a selection circuit 4150.

The pulse generation circuit 4142 may generate a pulse signal SUM_P that pulses for a set period according to the deactivation of the sum signal BISTEN_SUM, and output a test pulse signal BISTENP according to the pulse signal SUM_P or the MRS pulse signal MRS_BISTENP. The pulse generation circuit 4142 may include a pulse generator 4142A and an output circuit 4142B. The pulse generator 4142A may generate the pulse signal SUM_P that pulses for the set period according to the deactivation of the sum signal BISTEN_SUM. The output circuit 4142B may be composed of an OR gate OR2 that performs a logic OR operation on the pulse signal SUM_P and the MRS pulse signal MRS_BISTENP.

The counting circuit 4144 may generate a counting signal BISTCNT<0:1> by counting the number of times the test pulse signal BISTENP toggles.

The first signal output circuit 4146 may output the test pulse signal BISTENP as a first control signal BIST_S according to a comparison result COMP2 when bits of the counting signal BISTCNT<0:1> and the bits of the chip ID S<0:1> are different from each other. The first signal output circuit 4146 may include a first comparison circuit 4146A and a first output circuit 4146B.

The first comparison circuit 4146A may compare the bits of the counting signal BISTCNT<0:1> with the bits of the chip ID S<0:1>, and output a logic high level comparison result COMP2 when the bits of the counting signal BISTCNT<0:1> and the bits of the chip ID S<0:1> are different from each other. The first comparison circuit 4146A may include first and second XOR gates XR1 and XR2 that perform a logic exclusive OR operation on the bits of the counting signal BISTCNT<0:1> and the bits of the chip ID S<0:1> and a first AND gate AD3 that performs a logic AND operation on the output of the first XOR gate XR1 and the output of the second XOR gate XR2. The first output circuit 4146B may output the test pulse signal BISTENP as the first control signal BIST_S according to the comparison result COMP2 of the first comparison circuit 4146A. When the logic high level comparison result COMP2 is inputted, the first output circuit 4146B may output the test pulse signal BISTENP as the first control signal BIST_S. The first output circuit 4146B may include a second AND gate AD4 that performs a logic AND operation on the comparison result COMP2 and the test pulse signal BISTENP.

The second signal output circuit 4148 may output the MRS pulse signal MRS_BISTENP as a second control signal BIST_P according to a comparison result COMP3 when the bits of the chip select signal TSV_C_MRS<0:1> transferred through the third through electrode C_TSV<0:1> and the bits of the chip ID S<0:1> coincide with each other. The second signal output circuit 4148 may include a second comparison circuit 4148A and a second output circuit 4148B.

The second comparison circuit 4148A may compare the bits of the chip select signal TSV_C_MRS<0:1> with the bits of the chip ID S<0:1>, and output a logic high level comparison result COMP3 when the bits of the chip select signal TSV_C_MRS<0:1> and the bits of the chip ID S<0:1> coincide with each other. The second comparison circuit 4148A may include first and second XNOR gates XNR3 and XNR4 that perform a logic exclusive NOR operation on the bits of the chip select signal TSV_C_MRS<0:1> and the bits of the chip ID S<0:1> and a third AND gate AD5 that performs a logic AND operation on the output of the first XNOR gate XNR3 and the output of the second XNOR gate XNR4. The second output circuit 4148B may output the MRS pulse signal MRS_BISTENP as the second control signal BIST_P according to the comparison result COMP3 of the second comparison circuit 4148A. When the logic high level comparison result COMP3 is inputted, the second output circuit 4148B is may output the MRS pulse signal MRS_BISTENP as the second control signal BIST_P. The second output circuit 4148B may include a fourth AND gate AD6 that performs a logic AND operation on the comparison result COMP3 and the MRS pulse signal MRS_BISTENP.

The selection circuit 4150 may select the first control signal BIST_S or the second control signal BIST_P according to a test mode signal TM, and output the test start signal BIST_START. For example, the test mode signal TM may be set in advance through fuse cutting and the like, set to a logic low level for a sequential test operation, and set to a logic high level for an independent test operation. The selection circuit 4150 may select the first control signal BIST_S according to the logic low level test mode signal TM, and output the test start signal BIST_START.

With reference to FIGS. 1 to 14, the test operation of the stacked semiconductor device is described below.

Figure 14:
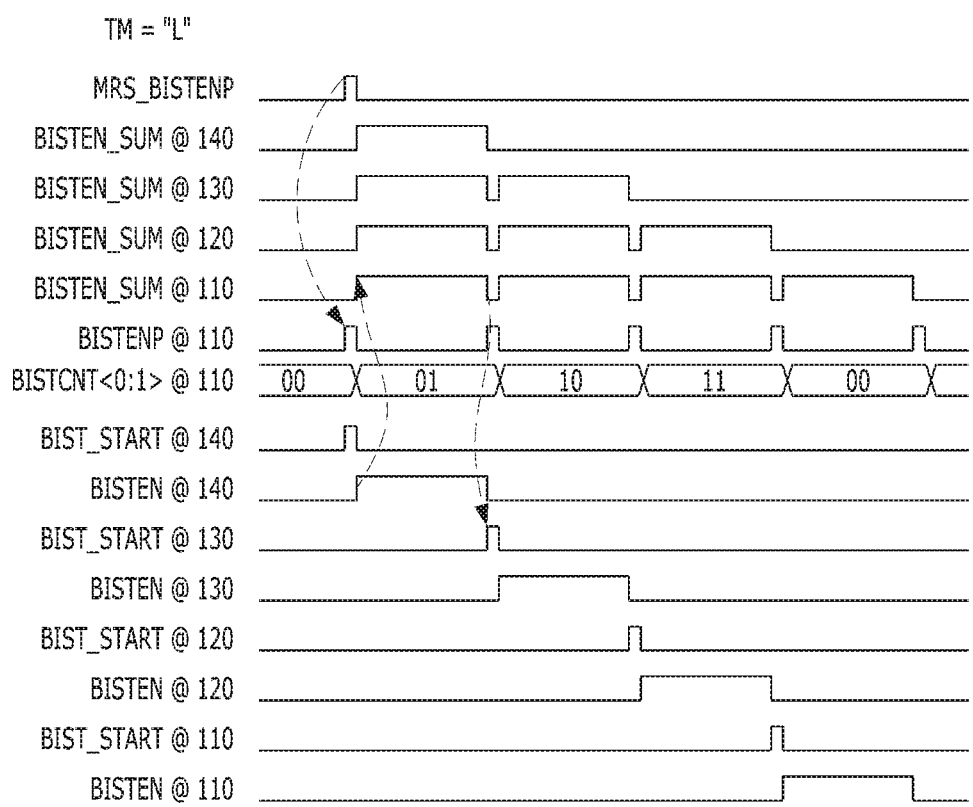
FIG. 14 is an operation waveform diagram illustrating a test operation of a stacked semiconductor device in accordance with an embodiment of the present invention.

FIG. 14 is an operation waveform diagram illustrating the test operation of the stacked semiconductor device in accordance with an embodiment of the present invention. FIG. 14 illustrates an operation of the control signal generation circuit 410 when the test mode signal TM is set to a logic low level.

Referring to FIG. 14, when the MRS command TSV_MRS for the BIST is inputted through the first through electrode CMD_TSV, the MRS pulse signal MRS_BISTENP pulses for a set period. The pulse generation circuit 4142 outputs the test pulse signal BISTENP according to the activation of the MRS pulse signal MRS_BISTENP. The counting circuit 4144 outputs a counting signal BISTCNT<0:1> of an initial value "00".

In such a case, since "11" is assigned to the chip ID S<0:1> of the fourth semiconductor chip 140, the first signal output circuit 4146 of the fourth semiconductor chip 140 may output the test pulse signal BISTENP as the first control signal BIST_S, and the selection circuit 4150 may select the first control signal BIST_S to output a test start signal BIST_START@140. Accordingly, the command/address generation circuit 430 of the fourth semiconductor chip 140 activates a test enable signal BISTEN@140 and generates the test command BIST_CMD and the test address BIST_ADD<0:m>. The signal transfer circuit 200 of the fourth semiconductor chip 140 multiplexes the test row address BIST_RADD<0:m> and the address ADDR<0:m> to output a multiplexed address and multiplexes the chip ID S<0:1> and the chip select signal C<0:1> to output a multiplexed address according to the test enable signal BISTEN. The transmission control circuit 310 of the fourth semiconductor chip 140 controls the signals transferred from the signal transfer circuit 200 to be transferred to the first to third through electrodes CMD_TSV, ADDR_TSV<0:m>, and C_TSV<0:1> according to the test enable signal BISTEN. The reception control circuit 320 receives the commands TSV_xxx and TSV_yyy, the addresses TSV_ADDR_xxx<0:m> and TSV_ADDR_yyy<0:m>, and the chip select signals TSV_C_xxx<0:1> and TSV_C_yyy<0:1> through the first to third through electrodes CMD_TSV, ADDR_TSV<0:m>, and C_TSV<0:1>. During the test operation, since the chip ID S<0:1> is multiplexed with the chip select signals TSV_C_xxx<0:1> and TSV_C_yyy<0:1> and is transferred, the command reception circuit 112 may transfer the test command BIST_CMD to the core area (or the internal circuit) of the first semiconductor chip 110. Accordingly, the test operation may be performed in the core area (or the internal circuit) in which the test command BIST_CMD and the addresses TSV_ADDR_xxx<0:m> and TSV_ADDR_yyy<0:m> are received.

The sum signal generator 412 of the fourth semiconductor chip 140 activates a sum signal BISTEN_SUM@140 according to the test enable signal BISTEN. The sum signal generators 412 of the third, second, and first semiconductor chips 130, 120, and 110 may activate sum signals BISTEN_SUM@130, BISTEN_SUM@120, and BISTEN_SUM@110 of the semiconductor chips according to sum signals sequentially transferred from upper chips through the fourth through electrodes SUM_TSV3 to SUM_TSV1, respectively. When the test operation of the fourth semiconductor chip 140 is completed, the test enable signal BISTEN@140 may be deactivated according to the test end signal BIST_END, so that the sum signal BISTEN_SUM of the semiconductor chips may also be deactivated.

The pulse generation circuit 4142 outputs the test pulse signal BISTENP according to the deactivation of the sum signal BISTEN_SUM, and the counting circuit 4144 generates a counting signal BISTCNT<0:1> of "01". Therefore, the control signal generation circuit 410 of the third semiconductor chip 130 may output the test pulse signal BISTENP as a test start signal BIST_START@130 and the command/address generation circuit 430 may perform an internal test operation by activating a test enable signal BISTEN@130.

When the test operation of the third semiconductor chip 130 is completed, the test enable signal BISTEN@130 may be deactivated according to the test end signal BIST_END, so that the sum signal BISTEN_SUM of the semiconductor chips may also be deactivated.

Therefore, the control signal generation circuit 410 of the second semiconductor chip 120 may output the test pulse signal BISTENP as a test start signal BIST_START@120 and the command/address generation circuit 430 may perform an internal test operation by activating a test enable signal BISTEN@120. In a similar manner, after the test operation of the second semiconductor chip 120 is completed, the test operation of the first semiconductor chip 110 may be performed. As described above, according to the present embodiment, when the test mode signal TM is set to a logic low level, it is possible to sequentially test from the uppermost semiconductor chip to the lowermost semiconductor chip of the stacked semiconductor chips.

On the other hand, when the test mode signal TM is set to a logic high level, the control signal generator 414 may generate the test start signal BIST_START according to the MRS pulse signal MRS_BISTENP generated from the MRS command MRS and the chip select signal TSV_C_MRS<0:1>, regardless of the sum signal BISTEN_SUM. That is, when the bits of the chip select signal TSV_C_MRS<0:1> transferred through the third through electrodes C_TSV<0:1> and the bits of the chip ID S<0:1> coincide with each other, the second signal output circuit 4148 of a corresponding semiconductor chip may output the MRS pulse signal MRS_BISTENP as the second control signal BIST_P and the selection circuit 4150 may select the second control signal BIST_P and output the test start signal BIST_START. Therefore, the command/address generation circuit 430 of the selected semiconductor chip 140 activates the test enable signal BISTEN and generates the test command BIST_CMD and the test address BIST_ADD<0:m>. The signal transfer circuit 200 multiplexes the test row address BIST_RADD<0:m> and the address ADDR<0:m> to output a multiplexed address and multiplexes the chip ID S<0:1> and the chip select signal C<0:1> to output a multiplexed address, so that the test operation may be performed in the core area (or the internal circuit) of the semiconductor chip 140.

As described above, according to embodiments, the plurality of stacked semiconductor chips are sequentially or independently subjected to the BIST, so that it is possible to substantially prevent instantaneous power-drop. Furthermore, according to embodiments, during the BIST, the transfer circuit multiplexes and transfers the test address, so that it is possible to transfer the test address by using an existing address line. Consequently, any increase in area may be minimized as compared with the case where the test address is transferred to a separate line and then is multiplexed in the reception circuit.

In FIG. 1 to FIG. 14, during the test operation, the command/address generation circuit 430 of the test control circuit 114 generates no test commands corresponding to the read with auto precharge command RDA and the write with auto precharge command WTA. Description is provided below for a case where the test operation is performed using the read with auto precharge command RDA and the write with auto precharge command WTA, and not generating the test command corresponding to the precharge command PCG.

Figure 15:
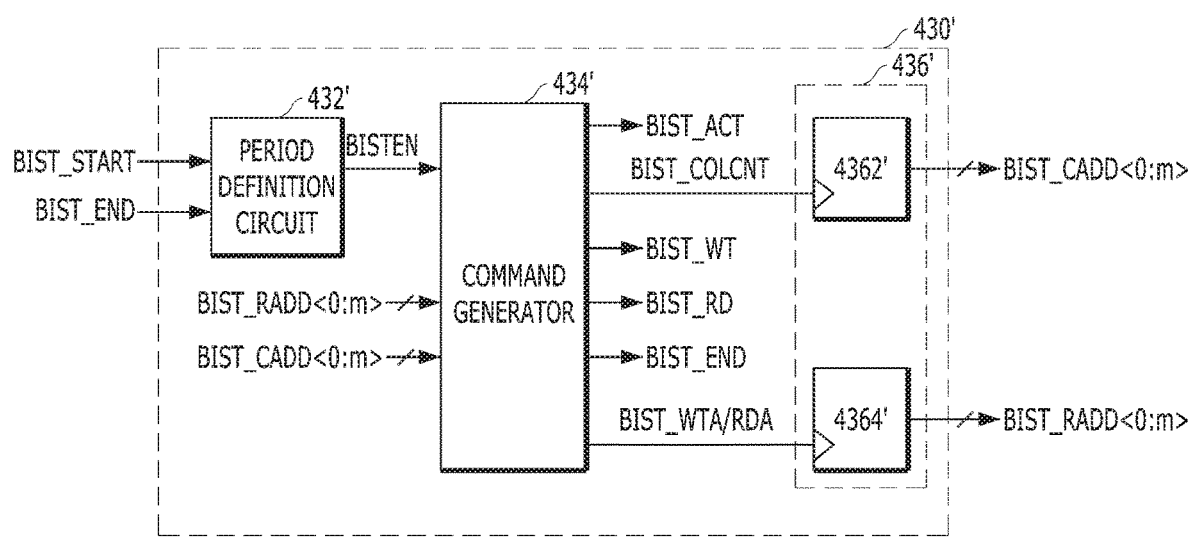
FIG. 15 is a diagram illustrating a configuration of a command/address generation circuit of a test control circuit in accordance with another embodiment of the present invention.
Figure 16:
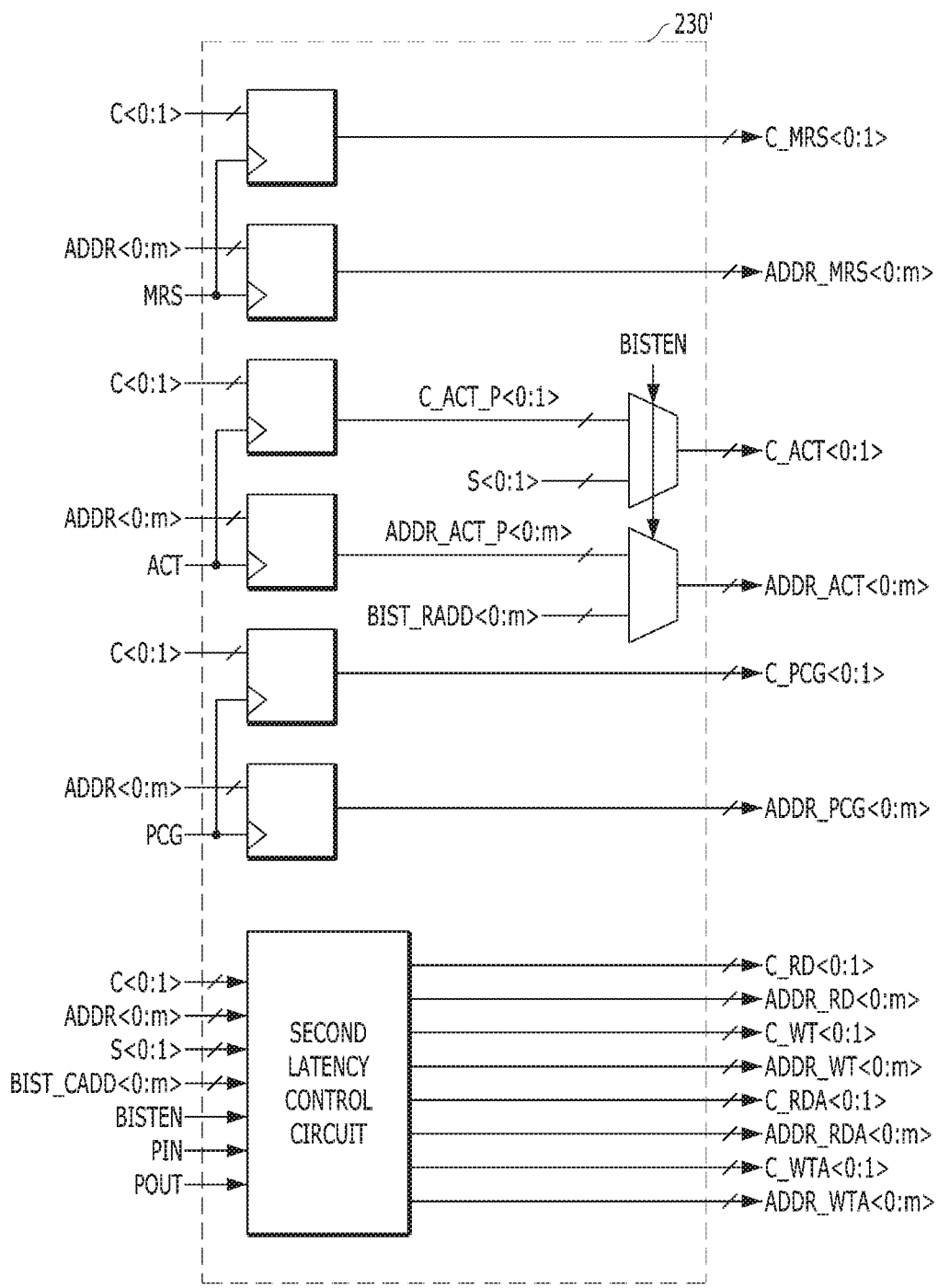
FIG. 16 is a block diagram illustrating a detailed configuration of an address transfer circuit of FIG. 15.
Figure 17:
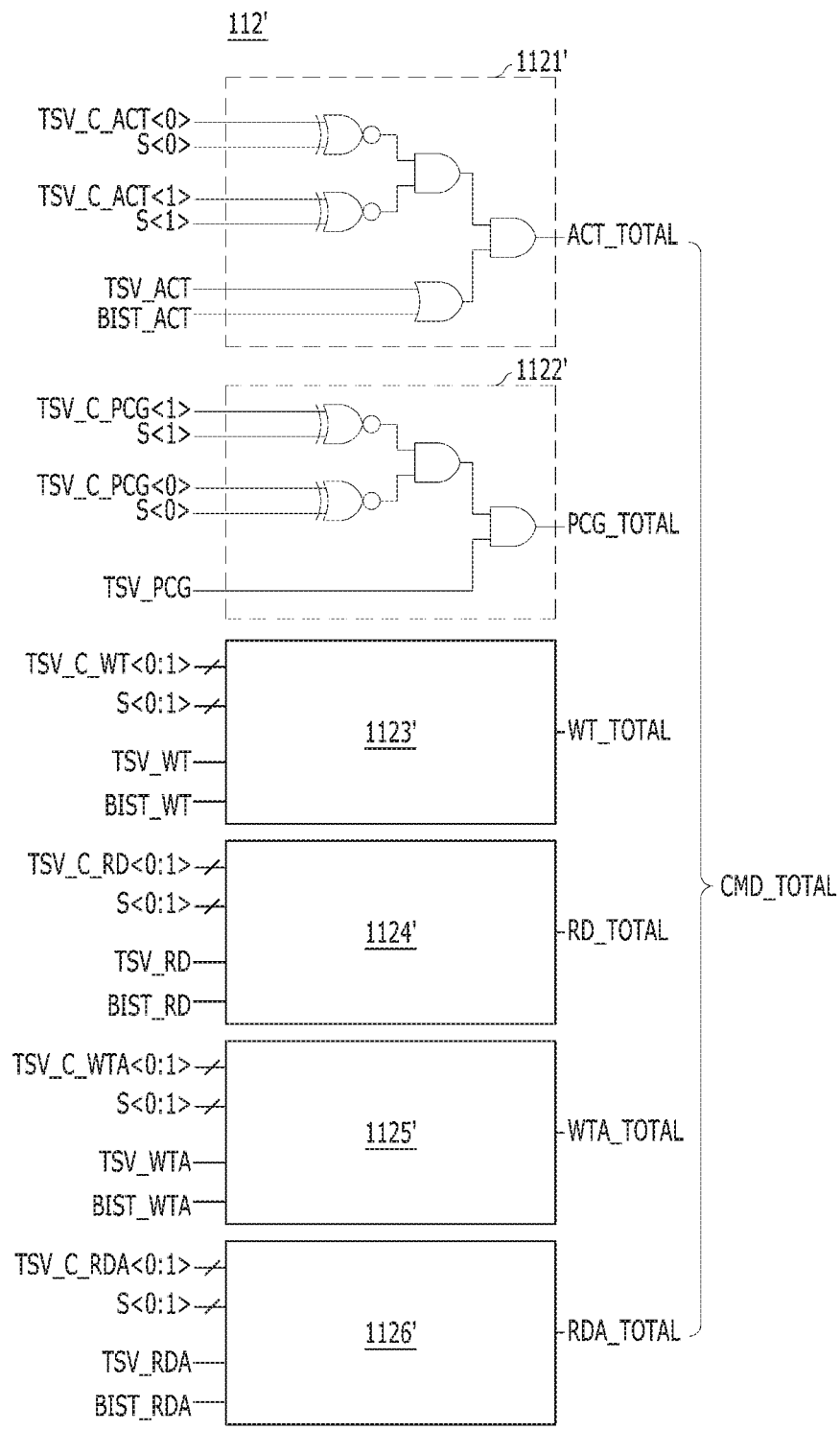
FIG. 17 is a detailed circuit diagram of a command reception circuit of FIG. 15.

FIG. 15 is a diagram illustrating a configuration of a command/address generation circuit 430' of a test control circuit in accordance with another embodiment of the present invention. FIG. 16 is a block diagram illustrating a detailed configuration of an address transfer circuit 230' in accordance with the embodiment of FIG. 15. FIG. 17 is a detailed circuit diagram of a command reception circuit 112' in accordance with the embodiment of FIG. 15.

Referring to FIG. 15, the command/address generation circuit 430' may include a period definition circuit 432', a command generator 434', and an address generator 436'.

The period definition circuit 432° may generate the test enable signal BISTEN that is activated according to the test start signal BIST_START and is deactivated according to the test end signal BIST_END.

The command generator 434' may generate the test commands BIST_ACT, BIST_RD, BIST_WT, BIST_RDA, and BIST_WTA in a set order according to the test enable signal BISTEN. Furthermore, the command generator 434' may generate the column counting signal BIST_COLCNT that sequentially increases, and generate the test end signal BIST_END that is activated when the test row address BIST_RADD<0:m> and the test column address BIST_CADD<0:m> reach a maximum value. Particularly, the command generator 434' of FIG. 15 may generate the test commands BIST_RDA and BIST_WTA corresponding to the read with auto precharge command RDA and the write with auto precharge command WTA, and not generating a test command (BIST_PCG of FIG. 11) corresponding to the precharge command PCG.

The address generator 436' may include a first counter 4362' that increases the test column address BIST_CADD<0:m> according to the column counting signal BIST_COLCNT, and a second counter 4364' that increases the test row address BIST_RADD<0:m> according to the test command BIST_RDA or the test command BIST_WTA.

Referring to FIG. 16, the address transfer circuit 230' may have substantially the same configuration as that of the address transfer circuit 230 of FIG. 5, except for the omission of the third selector 239 and the fourth selector 240 for multiplexing the addresses ADDR_PCG<0:m> and the chip select signal C_PCG<0:1> corresponding to the precharge command PCG.

Referring to FIG. 17, the command reception circuit 112' may include first to sixth transfer circuits 1121' to 1126'. In FIG. 10, since no test commands corresponding to the read with auto precharge command RDA and the write with auto precharge command WTA are generated during the test operation, the fifth and sixth transfer circuits 1125 and 1126 of FIG. 10 may have a configuration similar to that of the first transfer circuit 1121, except that the OR gate OR1 is omitted. On the other hand, in FIG. 17, since no test command corresponding to the precharge command PCG is generated during the test operation, an OR gate for summing test commands may be omitted in the second transfer circuit 1122' of FIG. 17.

As described above, the stacked semiconductor device in accordance with another embodiment performs the precharge operation by using the read with auto precharge command RDA and the write with auto precharge command WTA instead of the precharge command PCG, so that it is possible to omit the selector for multiplexing the address ADDR_PCG<0:m> and the chip select signal C_PCG<0:1> corresponding to the precharge command PCG. Consequently, it is possible to minimize an increase in an area due to circuits additionally disposed for the BIST.

Figure 18:
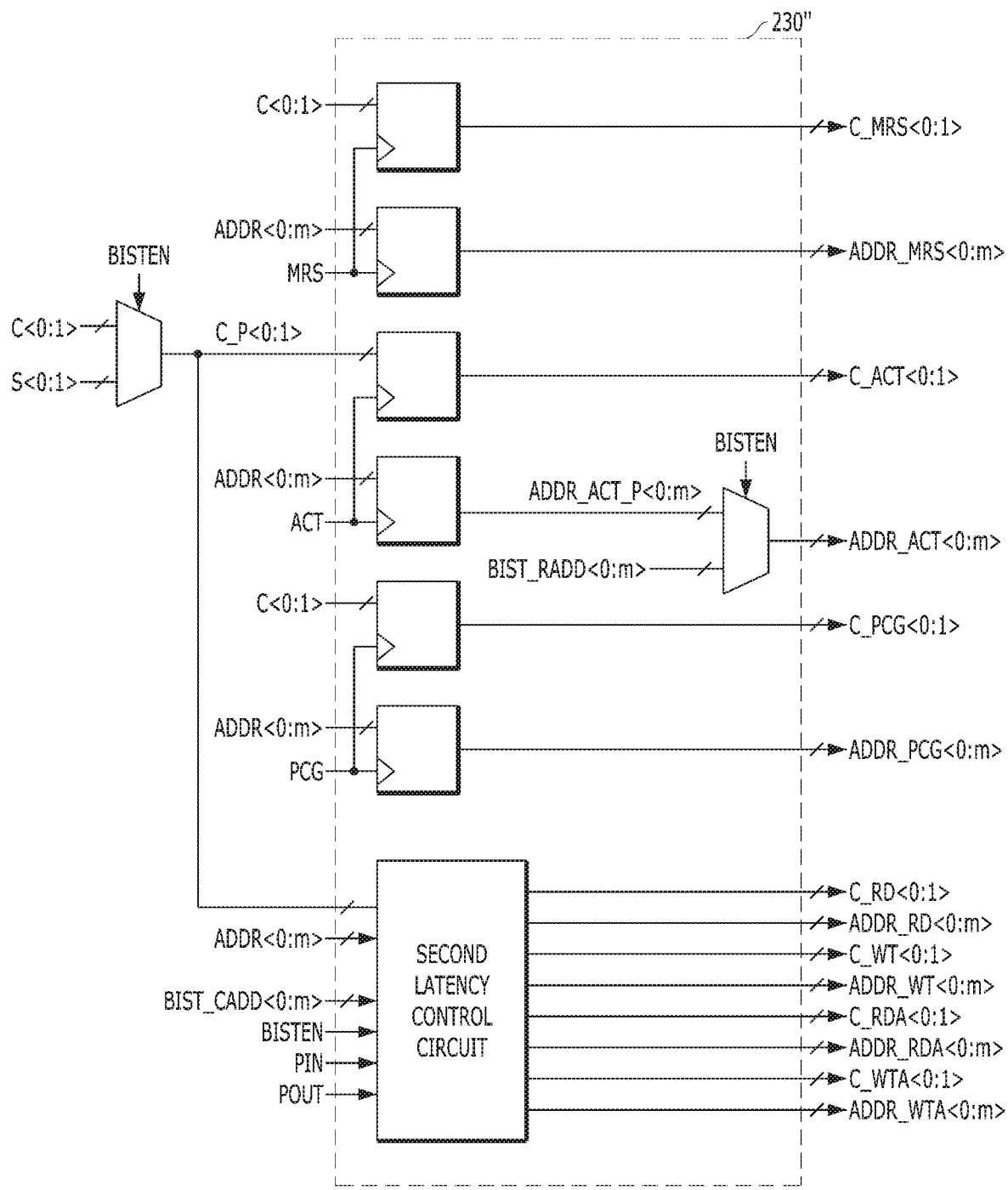
FIG. 18 is a block diagram illustrating a detailed configuration of an address transfer circuit in accordance with another embodiment of the present invention.

FIG. 18 is a block diagram illustrating a detailed configuration of an address transfer circuit 230" in accordance with another embodiment of the present invention. The address transfer circuit 230" of FIG. 18 corresponds to another embodiment the address transfer circuit 230' of FIG. 16.

Referring to FIG. 18, the address transfer circuit 230" may have substantially the same configuration as that of the address transfer circuit 230 of FIG. 8, except for the omission of the third selector 243 for multiplexing the addresses ADDR_PCG<0:m> corresponding to the precharge command PCG.

As described above, according to the address transfer circuit 230" in accordance with another embodiment, the selector is disposed in front of the latches and simultaneously it is possible to omit the selector for multiplexing the address ADDR_PCG<0:m> corresponding to the precharge command PCG, so that it is possible to additionally reduce an increase in an area due to the BIST.

Although various embodiments have been illustrated and described, it will be apparent to those skilled in the art in light of the present disclosure that various changes and modifications may be made without departing from the spirit and scope of the invention as defined in the following claims.

For example, the positions and the types of logic gates and the transistor exemplified in the disclosed embodiments may be different according to the polarity of an inputted signal.

What is claimed is:

1. A stacked semiconductor device comprising:
a plurality of semiconductor chips stacked in a vertical direction, electrically coupled through a plurality of through electrodes, and assigned with respective chip identifications (IDs) to distinguish one from another,
wherein each of the semiconductor chips comprises:
a signal transfer circuit suitable for respectively transferring a command, an address, and a chip select signal to first to third through electrodes, and respectively transferring a test address and the corresponding chip ID to the second and third through electrodes according to a test control signal;
a command reception circuit suitable for transferring a test command or a signal, transferred from the first through electrode, to an internal circuit when a signal transferred from the third through electrode is identical to the corresponding chip ID; and
a test control circuit suitable for activating the test control signal according to deactivation of a test control signal of an upper chip, of the plurality of semiconductor chips, and generating the test command and the test address according to the test control signal.

2. The stacked semiconductor device of claim 1, wherein the test control circuit of an uppermost chip, of the plurality of semiconductor chips, activates a test control signal of the uppermost chip according to a specific command.

3. The stacked semiconductor device of claim 2, wherein the specific command includes a mode register set (MRS) command.

4. The stacked semiconductor device of claim 1, wherein the test control signal includes a test enable signal activated for a test operation, and a sum signal generated by summing the test enable signal from an uppermost chip to a corresponding chip, of the plurality of semiconductor chips.

5. The stacked semiconductor device of claim 4, wherein the test control circuit comprises:
a control signal generation circuit suitable for generating a sum signal of the corresponding chip by summing the test enable signal and the sum signal transferred from the upper chip through a fourth through electrode, and activating a test start signal according to deactivation of the sum signal of the corresponding chip; and
a command/address generation circuit suitable for activating the test enable signal according to the test start signal, and generating the test address and the test command according to the test enable signal.

6. The stacked semiconductor device of claim 5, wherein the control signal generation circuit comprises:
a sum signal generator suitable for generating the sum signal of the corresponding chip according to the sum signal of the upper chip or the test enable signal; and
a control signal generator suitable for activating the test start signal according to a comparison result of the chip ID and a counting signal which is generated by counting deactivation of the sum signal of the corresponding chip or activation of a mode register set (MRS) command.

7. The stacked semiconductor device of claim 6, wherein the sum signal generator comprises:
a node driving circuit suitable for driving a first node according to the sum signal of the upper chip; and
a sum circuit suitable for outputting the sum signal of the corresponding chip by performing a logic OR operation on a signal of the first node and the test control signal.

8. The stacked semiconductor device of claim 6, wherein the control signal generation unit comprises:
a pulse generation circuit suitable for generating a pulse signal pulsing for a set period according to the deactivation of the sum signal of the corresponding chip, and generating a test pulse signal according to the pulse signal or the MRS command;
a counting circuit suitable for generating the counting signal by counting the number of times the test pulse signal toggles; and
a signal output circuit suitable for outputting the test pulse signal as the test control signal when bits of the counting signal and bits of the chip ID are different from each other.

9. The stacked semiconductor device of claim 4, wherein the signal transfer circuit comprises:
a command transfer circuit suitable for generating a row-based command and a column-based command by decoding the command, generating a delayed column-based command by adding latency to the column-based command, and transferring the delayed column-based command to the first through electrode; and
an address transfer circuit suitable for multiplexing the test address and the address to transfer a multiplexed address to the second through electrode, and multiplexing the chip ID and the chip select signal to transfer a multiplexed signal to the third through electrode, according to the test enable signal.

10. The stacked semiconductor device of claim 9, wherein the command transfer circuit comprises:
a command decoder suitable for generating the row-based command and the column-based command by decoding the command; and
a first latency control circuit suitable for generating the delayed column-based command by adding latency to the column-based command, the latency corresponding to at least one of additive latency (AL), column address strobe (CAS) write latency (CWL), a read-to-precharge time (RTP), and a write recovery time (tWR).

11. The stacked semiconductor device of claim 9,
wherein the row-based command includes a mode register set (MRS) command, an active command, and a precharge command, and
wherein the delayed column-based command includes a read command, a write command, a read with auto precharge command, and a write with auto precharge command.

12. The stacked semiconductor device of claim 9, wherein the address transfer circuit comprises:

a plurality of latches suitable for latching the address and the chip select signal according to the row-based command and outputting a latched address and a latched chip select signal;
a plurality of selectors suitable for selectively outputting one of the test address and the latched address, and selectively outputting one of the chip ID and the latched chip select signal, according to the test enable signal; and
a second latency control circuit suitable for generating a delayed address and a delayed chip select signal by adding the latency to the address and the chip select signal, and selectively outputting one of the test address and the delayed address and selectively outputting one of the chip ID and the delayed chip select signal, according to the test enable signal.

13. The stacked semiconductor device of claim 12, wherein the second latency control circuit comprises:
an additive latency adding circuit suitable for outputting a first address and a first chip select signal by delaying the address and the chip select signal by additive latency (AL), and outputting the test address and the chip ID as the first address and the first chip select signal according to the test enable signal;
a column address strobe (CAS) write latency adding circuit suitable for outputting a second address and a second chip select signal by delaying the first address and the first chip select signal by CAS write latency (CWL);
a read-to-precharge adding circuit suitable for outputting a third address and a third chip select signal by delaying the first address and the first chip select signal by a read-to-precharge time (RTP); and
a write recovery adding circuit suitable for outputting a fourth address and a fourth chip select signal by delaying the second address and the second chip select signal by a write recovery time (tWR).

14. The stacked semiconductor device of claim 13, wherein the additive latency adding circuit comprises:
a first multiplexing circuit suitable for outputting the first address by delaying the address by the additive latency (AL), while outputting the test address as the first address when the test enable signal is activated; and
a second multiplexing circuit suitable for outputting the first chip select signal by delaying the chip select signal by the additive latency (AL), while outputting the chip ID as the first chip select signal when the test enable signal is activated.

15. The stacked semiconductor device of claim 9, wherein the address transfer circuit comprises:
a first selector suitable for selectively outputting the chip ID and the chip select signal according to the test enable signal;
a plurality of latches suitable for latching the address and an output signal of the first selection unit according to the row-based command and outputting a latched address and a latched chip select signal;
a second selector suitable for selectively outputting one of the test address and the latched address according to the test enable signal; and
a second latency control circuit suitable for generating a delayed address and a delayed chip select signal by adding the latency to the address and the chip select signal, and selectively outputting one of the test address and the delayed address according to the test enable signal.

16. The stacked semiconductor device of claim 1, wherein each of the semiconductor chips further comprises:
a transmission control circuit suitable for transferring signals from the signal transfer circuit to the through electrodes according to the test control signal; and
a reception control circuit suitable for receiving the signals from the through electrodes.

17. The stacked semiconductor device of claim 16,
wherein, if the test control signal is deactivated, the transmission control circuit is activated when the chip ID has a specific value to transfer the signals from the signal transfer circuit to the through electrodes, and
wherein, if the test control signal is activated, the transmission control circuit transfers the signals from the signal transfer circuit to the through electrodes, regardless of the chip ID.

18. The stacked semiconductor device of claim 1, wherein the command reception circuit comprises:
a comparison circuit suitable for comparing the chip ID with the signal transferred from the third through electrode; and
an output circuit suitable for transferring the test command or the signal transferred from the first through electrode, to the internal circuit, according to a comparison result of the comparison circuit.

19. A stacked semiconductor device comprising:
a plurality of semiconductor chips stacked in a vertical direction, electrically coupled through a plurality of through electrodes, and assigned with respective chip identifications (IDs) to distinguish one from another,
wherein each of the semiconductor chips comprises:
a control signal generation circuit suitable for generating a sum signal by summing a sum signal of an upper chip and a test enable signal of a corresponding chip, and activating a test start signal according to deactivation of the sum signal of the corresponding chip;
a command/address generation circuit suitable for activating the test enable signal according to the test start signal, and generating a test address and a test command according to the test enable signal; and
an internal circuit suitable for performing a test operation based on the test address and the test command.

20. The stacked semiconductor device of claim 19, wherein the control signal generation circuit of an uppermost chip activates a sum signal of the uppermost chip according to a mode register set (MRS) command.

21. The stacked semiconductor device of claim 19, wherein the control signal generation circuit comprises:
a sum signal generator suitable for generating the sum signal of the corresponding chip according to the sum signal of the upper chip or the test enable signal; and
a control signal generator suitable for activating the test start signal according to a comparison result of the chip ID and a counting signal which is generated by counting deactivation of the sum signal of the corresponding chip or activation of a mode register set (MRS) command.

22. The stacked semiconductor device of claim 21, wherein the sum signal generator comprises:
a node driving circuit suitable for driving a first node according to the sum signal of the upper chip; and
a sum circuit suitable for outputting the sum signal of the corresponding chip by performing a logic OR operation on a signal of the first node and the test enable signal.

23. The stacked semiconductor device of claim 21, wherein the control signal generator comprises:

a pulse generation circuit suitable for generating a pulse signal pulsing for a set period according to the deactivation of the sum signal of the corresponding chip, and generating a test pulse signal according to the pulse signal or the MRS command;

a counting circuit suitable for generating the counting signal by counting the number of times the test pulse signal toggles; and a signal output circuit suitable for outputting the test pulse signal as the test start signal when bits of the counting signal and bits of the chip ID are different from each other.

24. The stacked semiconductor device of claim 19, wherein each of the semiconductor chips further comprises:

a signal transfer circuit suitable for transferring a command, an address, and a chip select signal to the through electrodes while multiplexing the test address and the address to transfer a multiplexed address and multiplexing the chip ID and the chip select signal to transfer a multiplexed signal, according to the test enable signal.

25. The stacked semiconductor device of claim 24, wherein each of the semiconductor chips further comprises:

a transmission control circuit suitable for transferring the command, the address, and the chip select signal from the signal transfer circuit to the through electrodes according to the test enable signal and the sum signal;

a reception control circuit suitable for receiving the command, the address, and the chip select signal from the through electrodes; and a command reception circuit suitable for transferring the test command or the command transferred from the reception control circuit, to the internal circuit when the chip select signal transferred from the reception control circuit is identical to the chip ID.

26. The stacked semiconductor device of claim 25, wherein, when the sum signal of the corresponding chip is deactivated, the transmission control circuit is activated when the chip ID has a specific value to transfer the signals from the signal transfer circuit to the through electrodes, and wherein, when the sum signal of the corresponding chip is activated, the transmission control circuit transfers the signals from the signal transfer circuit to the through electrodes, according to the test enable signal.

27. A test method of a stacked semiconductor device, comprising:

activating, by each of a plurality of semiconductor chips, a corresponding test control signal according to a deactivation of a test control signal of an upper chip of the plurality of semiconductor chips, which are stacked, electrically coupled through a plurality of through electrodes, and assigned with respective chip identifications (IDs) to distinguish one from another;

generating, by each of the semiconductor chips, a test command and a test address according to the corresponding test control signal; and performing, by each of the semiconductor chips, a test operation of an internal circuit according to the test address and the test command; and deactivating, by each of the semiconductor chips, the corresponding test control signal according to completion of the test operation.

28. The test method of claim 27, wherein the specific command includes a mode register set (MRS) command.

29. The test method of claim 27, wherein the performing of the test operation of the internal circuit further comprises:

transferring a command, an address, and a chip select signal to the through electrodes while multiplexing the test address and the address to transfer a multiplexed address and multiplexing the chip ID and the chip select signal to transfer a multiplexed signal, according to the test enable signal;

providing the test command or the command transferred from the through electrodes as an internal command when the chip select signal is identical to the chip ID; and performing the test operation of the internal circuit according to the internal command and the address transferred from the through electrodes.

30. A stacked semiconductor device comprising:

a plurality of stacked semiconductor chips, the plurality of semiconductor chips including an uppermost chip and a lowermost chip; and a plurality of through electrodes suitable for coupling the plurality of semiconductor chips, wherein the plurality of semiconductor chips sequentially performs a test operation in an order from the uppermost chip to the lowermost chip, and wherein each of the plurality of semiconductor chips includes a test control circuit, the test control circuit for the uppermost chip receiving a command from an external source to activate a test operation on the uppermost chip, and the test control circuit for each of the remaining semiconductor chips receiving a deactivated test control signal indicating completion of the test operation on the immediately above semiconductor chip through a through electrode, among the plurality of through electrodes, to activate the corresponding test operation.

* * * * *